(12) United States Patent
Kelber et al.

(10) Patent No.: US 7,534,967 B2
(45) Date of Patent: May 19, 2009

(54) CONDUCTOR STRUCTURES INCLUDING PENETRABLE MATERIALS

(75) Inventors: Jeffry A. Kelber, Plano, TX (US); Jipu Lei, Denton, TX (US); Noel P. Magtoto, Denton, TX (US); Sergei Rudenja, Denton, TX (US)

(73) Assignee: University of North Texas, Denton, TX (US)

( * ) Notice: Subject to any disclaimer, the term of this patent is extended or adjusted under 35 U.S.C. 154(b) by 812 days.

(21) Appl. No.: 10/785,615

(22) Filed: Feb. 24, 2004

(65) Prior Publication Data

US 2004/0166658 A1    Aug. 26, 2004

Related U.S. Application Data

(60) Provisional application No. 60/449,974, filed on Feb. 25, 2003.

(51) Int. Cl.
*H01R 12/04*    (2006.01)
*H05K 1/11*    (2006.01)

(52) U.S. Cl. .................. 174/263; 174/250; 174/255

(58) Field of Classification Search .......... 438/585–650
See application file for complete search history.

(56) References Cited

U.S. PATENT DOCUMENTS

| | | | | |
|---|---|---|---|---|
| 6,182,500 B1 * | 2/2001 | Stokes et al. | ............... | 73/31.06 |
| 6,391,785 B1 * | 5/2002 | Satta et al. | ................... | 438/704 |
| 6,465,887 B1 * | 10/2002 | Chu et al. | ................... | 257/751 |
| 6,485,458 B1 * | 11/2002 | Takahashi | ................... | 604/104 |
| 6,800,542 B2 * | 10/2004 | Kim | ........................... | 438/585 |
| 6,806,124 B2 * | 10/2004 | Klauk et al. | ................. | 438/149 |
| 6,869,876 B2 * | 3/2005 | Norman et al. | ............. | 438/680 |
| 6,967,159 B2 * | 11/2005 | Vaartstra | ..................... | 438/649 |
| 2004/0005774 A1 * | 1/2004 | Toyoda et al. | ............... | 438/622 |
| 2004/0157441 A1 * | 8/2004 | Inoue et al. | ................. | 438/678 |
| 2005/0124154 A1 * | 6/2005 | Park et al. | ................... | 438/643 |

OTHER PUBLICATIONS

Bertel et al "The Adsorption of Bromine on Pt(111): Observation of an Irreversible Order-Disorder Transition" *Surface Science* 83:439-452 (1979).

Bhaskar et al. "X-ray photoelectron spectroscopy and micro-Raman analysis of conductive $RuO_2$ Thin Films" *Journal of Applied Physics*, 89(5):2987-2992, Nov. 8, 2000.

(Continued)

*Primary Examiner*—Tuan T Dinh
(74) *Attorney, Agent, or Firm*—Myers Bigel Sibley & Sajovec

(57) ABSTRACT

Conductor structures include a substrate, a first conducting layer that is selectively passivated from growth of unwanted surface layers by the application of a selective passivation layer, and a second conducting layer that is applied onto the selective passivation layer. The selective passivation layer prevents the combination of unwanted materials with the first conducting layer while allowing the combination of the applied second conducting layer with the first conducting layer. The selective passivation layer is displaced by the second conducting layer and remains as a passivation layer on the exposed surface of the second conducting layer being displaced, thereby protecting the first and second conducting layers from unwanted materials or unwanted surface layers. Methods of fabricating conductor structures are also provided.

5 Claims, 9 Drawing Sheets

OTHER PUBLICATIONS

Böttcher et al. "Formation of subsurface oxygen at Ru(0001)" *The Journal of Chemical Physics* 110(6):3186-3195 (1999).

Chan et al. "High-Pressure Oxidation of Ruthenium as Probed by Surface-Enhanced Raman and X-Ray Photoelectron Spectroscopies" *Journal of Catalysis* 172:336-345 (1997).

Chyan et al. "Electrodeposition of Copper Thin Film on Ruthenium A Potential Diffusion Barrier for Cu Interconnects" *Journal of the Electrochemical Society* 150(5):C347-C350 (2003).

Cumpson et al. "Elastic Scattering Corrections in AES and XPS. II. Estimating Attenuation Lengths and Conditions Required for their Valid Use in Overlayer/Substrate Experiments" *Surface and Interface Analysis* 25:430-446 (1997).

DiCenzo et al. XPS Studies of Adatom-Adatom Interactions: I/Ag(111) and I/Cu(111) *Surface Science* 121:411-420 (1982).

Feibelman "Partial Dissociation of Water on Ru(0001)" *Science* 295(5552):99-102 (2002).

Garwood, Jr. et al. "Surperlattices Formed by Interaction of Iodine, Water and Oxygen With the (111) Plane of an Fe-Cr-Ni Alloy fcc Single Crystal: Studies by Leed, Auger and Thermal Desorption Mass Spectroscopy" *Surface Science* 121:L524-L530 (1982).

Grant et al. "A Study of Ru(0001) and Rh(111) Surfaces Using Leed and Auger Electron Spectroscopy" *Surface Science* 21:76-85 (1970).

Hubbard "Electrochemistry at Well-Characterized Surfaces" *Chem. Rev* 88:633-656 (1988).

Hwang et al. "Surfactant-Assisted Metallorganic CVD of (111)-Oriented Copper Films with Excellent Surface Smoothness" *Electrochemical and Solid-State Letters* 3(3):138-140 (2000).

Kibler et al. "Initial stages of Pd deposition on Au(hkl) Part I: Pd on Au(111)" *Surface Science* 443:19-30 (1999).

Kim et al. "Chemical state of ruthenium submonolayers on a Pt(111) electrode" *Surface Science* 474:L203-L212 (2001).

Kiskinova et al. "Adsorption and Decomposition of $H_2O$ on a K-Covered Pt(111) Surface" *Surface Science*, 50:319-338 (1985).

Kolb et al. "Scanning Tunneling Microscopy for Metal Deposition Studies" *Interface* 8(1):26-30 (1999).

Kötz et al. "XPS Studies of Oxygen Evolution on Ru and $RuO_2$ Anodes" *Journal of the Electrochemical Society*, 130(4):825-829 (1983).

Lin et al. "Combined Ultrahigh Vacuum/Electrochemistry Study of the Adsorption of Lead on Clean and Sulfur-Modified Nickel Surfaces in Aqueous Environments" *Langmuir* 14:3673-3681 (1998).

Liu et al. "The Effects of an Iodine Surface Layer on Ru Reactivity in Air and during Cu Electrodeposition" *J. Electrochem. Soc*, 152(2):G115-G121 (2005).

Lu et al. "Adlattice Structure and Hydrophobicity of Pt(111) In Aqueous Potassium Iodide Solutions Influence of pH and Electrode Potential" *J. Electroanal. Chem.* 222:305-320 (1987).

Lu et al. "In Situ Scanning Tunneling Microscopy of (Bi)sulfate, Oxygen, and Iodine Adlayers Chemisorbed on a Well-Defined Ru(001) Electrode Prepared in a Non-Ultrahigh-Vacuum Environment" *Langmuir*, 18:754-762 (2002).

Madey et al. "Adsorption of Oxygen and Oxidation of CO on the Ruthenium (001) Surface" *Surface Science* 48:304-328 (1975).

Madhavaram et al. "Oxidation Reactions over $RuO_2$: A Comparative Study of the Reactivity of the (110) Single Crystal and Polycrystalline Surfaces" *Journal of Catalysis* 202:296-307 (2001).

Martinez-Ruiz et al. "Underpotential deposition of Cu on iodine-modified Au(111): an in situ scanning tunneling microscopy study" *Surface Science* 476:139-151 (2001).

Nakamura et al. "Monomer and tetramer water clusters adsorbed on Ru(0001)" *Chemical Physics Letters* 325:293-298 (2000).

Oskam et al. "Electrochemical Deposition of Copper on N-Si/TiN" *Journal of the Electrochemical Society* 146(4):1436-1441 (1999).

Quayum et al. "Mechanism for nucleation and growth of electrochemical palladium deposition on an Au(111) electrode" *Journal of Electroanalytical Chemistry* 520:126-132 (2002).

Reuter et al. "Atomistic description of oxide formation on metal surfaces: the example of ruthenium" *Chemical Physics Letters* 352:311-317 (2002).

Seshadri et al. "Sulfur Catalyzed Electrochemical Oxidation of Copper: A Combined Ultrahigh Vacuum Electrochemistry Study" *Journal of the Electrochemical Society* 146(5):1762-1765 (1999).

Seshadri et al. "The Promotion of the Anodic Dissolution of Polycrystalline Iron Surfaces by Adsorbed Sulfur: A UHV-Electrochemical Study" *Corrosion Science* 39(5):987-1000 (1997).

Shen et al. "An ESCA study of the interaction of oxygen with the surface of ruthenium" *Applied Surface Science* 51:47-60 (1991).

Sherwood "Curve fitting in surface analysis and the effect of background inclusion in the fitting process" *J. Vac. Sci. Technol A* 14(3):1424-1432, Jan. 29, 1996.

Shi et al. "Reaction between $H_2O$ and Cs on the Ru(001) surface" *Surface Science* 317:45-57 (1994).

Shue et al. "In Situ Scanning Tunneling Microscopy of Underpotential Deposition of Copper at Pt(100) Electrodes Coated with an Iodine Monolayer" *J. Phys. Chem. B* 105:5489-5496 (2001).

Smith et al. "Evaluation of precursors for chemical vapor deposition of ruthenium" *Thin Solid Films*, 376:73-81 (2000).

Stampfl et al. "Structure and Stability of a High-Coverage (X) Oxygen Phase on Ru(0001)" *Physical Review Letters*, 77(16):3371-3374 (1996).

Stickney et al. "Electrodeposition of Copper on Platinum (111) Surfaces Pretreated With Iodine" *Journal of the Electrochemical Society* 131(2):260-267 (1984).

Takahashi "Electroplating Copper Onto Resistive Barrier Films" *Journal of the Electrochemical Society* 147(4):1414-1417 (2000).

Tanaka et al. "Kinetics of Oxidization Processes of Ruthenium Particles" *J. Am. Ceram. Soc*. 81(10):2513-2516 (1998).

Tanuma et al. "Calculations of Electron Inelastic Mean Free Paths. V. Data for 14 Organic Compounds over the 50-2000 eV Range" *Surface and Interface Analysis* 21(3)165-176 (1994).

Wang et al. "Seedless Electrodeposition of Cu on Unmodified Tungsten" *Electrochemical and Solid-State Letters* 5(9):C-82-C84 (2002).

Wieckowski et al. "Preparation of Well-Defined Surfaces at Atmospheric Pressure: Studies by Electrochemistry and LEED of Pt(100) Pretreated With Iodine" *Inorg. Chem.* 23:565-569 (1984).

\* cited by examiner

CONDUCTOR STRUCTURES INCLUDING PENETRABLE MATERIALS

CROSS-REFERENCE TO PROVISIONAL APPLICATION

This application claims the benefit of provisional Application No. 60/449,974, filed Feb. 25, 2003, entitled Conductors Created by Metal Deposition Using a Selective Passivation Layer and Related Methods, which is assigned to the assignee of the present application, the disclosure of which is hereby incorporated herein by reference in its entirety as if set forth fully herein.

FIELD OF THE INVENTION

The present invention relates generally to conductors used in electronic components and related fabrication methods, and more particularly to metal conductors for use in electronic components created by deposition of metals and related fabrication methods.

BACKGROUND OF THE INVENTION

Known technologies used for the deposition of metal conductors for applications in electronic components may be hampered by problems which may include limited deposition, non-uniformity of deposition, and/or non-adhesion of the conductor caused by surface layers on the material receiving the deposition. These problems may adversely impact the possible applications of metal deposition conductors. The possible applications of such conductors in electronic components include but are not limited to applications such as bonding pads, vias, wires, and other parts of integrated circuits, printed circuit boards, and other electronic applications. Surface layers leading to problems such as those noted above can, for example, include oxides or hydroxides resulting from exposure of the material receiving the deposition to air during transport from a prior process to the conductor deposition step, and/or by growth of the surface layer during immersion in solvents. In some cases, such as electrodeposition, such problem surface layers can be an unwanted byproduct of the deposition process itself. Such problem surface layers may often be non-uniform in coverage of the material receiving the deposition, and can have spatially differing densities. These undesirable surface layers can, for example, locally reduce the current available for electroplating of metal conductors, thus producing non-uniformities in the plated layer. Alternatively, surface layers can remain as contaminants between the plated layer and the material receiving the deposition after deposition, which may result in poor adhesion of the deposited film to the underlying surface.

In the case of conductors used for integrated circuit applications, copper for conductors is often desired to be deposited over a thin barrier layer of metal such as tungsten or a combination of titanium and tungsten that are deposited over integrated circuit wafers as one process step in a total manufacturing process flow. These thin barrier layers may be provided to adhere to an underlying integrated circuit structure, and adhere to the copper conductor, as well as being a barrier that protects the underlying integrated circuit components from copper contamination. In this case it is usual to deposit a thin "seed" layer of copper over the barrier metal layer by sputtering, chemical vapor deposition and/or other techniques, to allow uniform coverage, good adhesion between the barrier metal and the copper, and/or good electrical conduction paths to a subsequent electroplating bath that is used to deposit an even thicker copper layer for the final conductor structure. The copper seed deposition by sputtering or chemical vapor deposition steps may be preceded by a chemical or physical process step such as sputter etch to remove detrimental surface layers that have built up on the barrier metal layer during prior processing or air exposure. The electrochemical baths used for integrated circuit conductor deposition may be treated with substantial quantities of "additives"—chemicals specifically directed to removing surface layers that are present on the barrier metal layer or seed layer at the beginning of the electrodeposition step, or that occur during the deposition. The steps used to circumvent the detrimental effects of these surface layers in both initial "seed" deposition and in electrodeposition may be costly and/or time consuming.

There is, thus, a desire for improved conductor structures created by metal deposition and for improved methods for use in fabrication of electronic components. Electronic component applications may desire the deposition of high quality films of metals such as copper and the like. Such films may be enhanced in performance if they can be deposited uniformly and with surfaces that allow firm adhesion to the material on which they are deposited as well as to subsequently deposited layers. There also may be a desire for methods of metal deposition that could allow such materials to be handled more easily and to be processed in sequential steps without potential degradation, which can result in improved passivated conductors.

SUMMARY OF THE INVENTION

Some embodiments of the present invention can provide conductor structures and related methods that can satisfy at least some of the above desires. Some embodiments of the present invention can produce uniform, adhering layers of conductors on integrated circuit wafers, substrates such as silicon and the like, circuit boards and/or other electronic components. Conductor structures according to some embodiments of the present invention comprise a first conducting layer, such as ruthenium or copper that is selectively passivated to reduce or minimize growth of unwanted surface layers such as oxides by the application of ~1 monolayer of iodine to function as a selective passivation layer. Conducting structures according to some embodiments of the invention may further comprise a second conducting layer that may decrease the effective resistance of the conducting structure. In some embodiments, the first conducting layer and the selective passivation layer can act as a base for additional metal deposition, such as the second conducting layer, wherein the selective passivation layer is displaced by the second conducing layer and remains as a passivating layer on the exposed surface of the second conducting layer being deposited. Other embodiments of conductor structures useful for integrated circuit fabrication and related processes for producing this conductor structure can use chemical vapor deposition, electrodeposition, and/or iodine vapor exposure.

In other embodiments of the present invention, a plurality of atomic layers of a second conductor are deposited on a first conductor by providing on the first conductor, a first material that is penetrable by the second conductor relative to at least a second material other than the second conductor. A plurality of atomic layers of the second conductor are deposited on the first conductor having the first material thereon, such that the first material is displaced through the plurality of atomic layers of the second conductor during the depositing, to provide the first material on the plurality of atomic layers of the second conductor, remote from the first layer. In some embodiments, the first conductor comprises a platinum group metal (ruthenium, rhodium, palladium, osmium, iridium and/or platinum), the first material comprises a halogen (fluorine, chlorine, bromine and/or iodine), the second conductor comprises a metal and the second material comprises oxygen (including oxides and/or hydroxides). Moreover, in some embodiments, the plurality of atomic layers of the second conductor are deposited by electrodepositing, and, in some embodiments, by overpotential depositing.

In yet other embodiments of the invention, copper is deposited on ruthenium by forming iodine on the ruthenium and depositing a plurality of atomic layers of the copper on the iodine, such that the iodine is displaced through the plurality of atomic layers of copper during the depositing to provide the iodine on the copper, remote from the ruthenium. In some embodiments, the plurality of atomic layers of copper are electrodeposited, and, in some embodiments, by overpotential depositing. In other embodiments, about one monolayer of iodine is provided. In yet other embodiments, chemical vapor deposition of about one monolayer of iodine is provided and, in some embodiments, chemical vapor deposition is provided by backfilling a deposition chamber with molecular iodine vapor.

Conductive structures according to some embodiments of the present invention comprise a first conductor, a plurality of atomic layers of a second conductor directly on the first conductor, and a first material directly on the plurality of atomic layers of the second conductor, remote from the first conductor. The first material is penetrable by the plurality of atomic layers of the second conductor relative to at least a second material other than the second conductor. In some embodiments, the first conductor comprises a platinum group metal, the first material comprises a halogen, the second conductor comprises a metal, and the second material comprises oxygen. In other embodiments, the first material comprises about a monolayer of the first material.

Conductive structures according to other embodiments of the invention comprise a first layer comprising ruthenium, a second layer comprising a plurality of atomic layers of copper directly on the first layer comprising ruthenium, and a third layer comprising iodine directly on the second layer comprising a plurality of atomic layers of copper, remote from the first layer comprising ruthenium. In some embodiments, the third layer comprises at least one monolayer of iodine. The first layer comprising ruthenium may be provided on a substrate, such as an integrated circuit substrate. A layer comprising, for example, tantalum, tantalum nitride, tungsten, tungsten nitride and/or other materials may be provided beneath the layer comprising ruthenium.

DETAILED DESCRIPTION

Figure 1A:
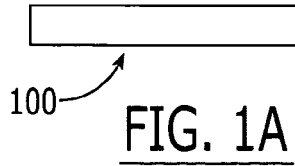
FIGS. 1A-1D are cross sectional views depicting conductor structures and related methods of forming conductor structures according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" or extending "directly onto" another element, there are no intervening elements present.

Figure 1B:
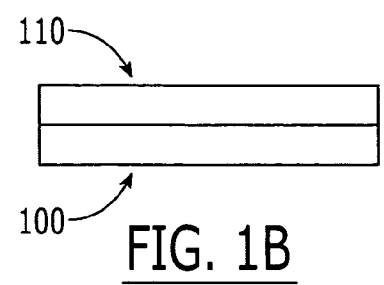
Figure 1C:
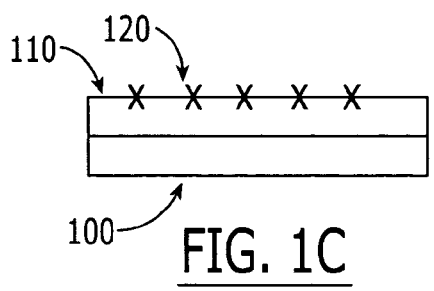
Figure 1D:
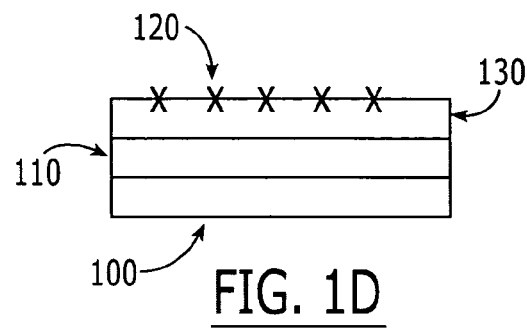

FIGS. 1A-1D are cross-sectional views depicting conductor structures and related methods of forming conductor structures according to embodiments of the present invention. Referring now to FIG. 1A, layer 100 is a substrate with an exposed surface. Such a substrate might be, for example, an Integrated Circuit wafer comprised of silicon and/or other suitable substrate materials, that, in some embodiments, has completed fabrication through the step of contact formation and is ready for application of conductors for the purpose of electrically interconnecting individual components on the integrated circuit. To form the conductor structure, a first conducting layer 110, as shown in FIG. 1B, comprising a conducting material such as ruthenium, for example, is deposited on the surface of the substrate. A selective passivation layer 120, as shown in FIG. 1C, comprising a thin layer (~1 monolayer, in some embodiments, as defined below) of iodine for example, is next deposited on an exposed surface of the first conducting layer 110. A second conducting layer 130, as shown in FIG. 1D, comprising a conducting material such as copper for example, is applied on an exposed surface of the substrate that has been applied with the successive first conducting layer 110 and selective passivation layer 120, by a process such as electrodeposition, electroless deposition, and/or the like. During deposition of the second conducting layer 130, the iodine selective passivation layer 120 permits the second conducting layer 130 to penetrate through to the first conducting layer surface 110 and adhere thereto, while the iodine selective passivation layer 120 transfers to an exposed surface of the second conducting layer 130 and provides selective passivation to the exposed surface of the second conducting layer 130.

In this disclosure "passivation" is used in its usual meaning to those skilled in this art to represent reduction or prevention of the underlying surface from interaction with materials that are outside the exposed surfaces of the passivating layer. Such passivation can, for example, be a result of the passivating layer preventing physical passage of the undesired materials, and/or by stronger bonding of the passivating layer to the protected surface than would be the bonding with the undesired materials.

In this disclosure "selective passivation" is defined as reduction or prevention of the protected surface from interaction with undesired materials, but allowing interaction with desired materials. Examples that illustrate these definitions are, for example, selective passivating layers that prevent interaction with oxygen or hydroxides yet allow deposition of metals such as copper. In this disclosure "~1 monolayer" or "about one monolayer" is defined as a layer that provides substantially complete coverage of the surface with the selective passivation layer in an atomic or molecular network that is essentially one atomic or molecular layer thick. In the case of iodine passivation for example, this layer may be formed as a network of iodine molecules that are loosely bound to the underlying metal surface and are bound together on the surface in a structure that does not allow substantial interaction of the substrate with materials such as oxygen or hydroxides but does allow substantial interaction with, for example, electrodepositing metal such as copper.

Some embodiments of the present invention are provided by a conductor structure of FIG. 1C, wherein the substrate 100 comprises an integrated circuit wafer that has completed fabrication through the step of contact formation and is ready for application of conductors for the purpose of electrically interconnecting individual integrated circuit components. The first conducting layer 110 applied on the surface comprises ruthenium metal in some embodiments. A layer comprising, for example, Ta, TaNx, W, WNx and/or other materials may be provided beneath the ruthenium metal. Selective passivation layer 120 comprises a thin layer (~1 monolayer) of iodine applied on the first conducing layer in some embodiments. In some embodiments, the iodine selective passivating layer 120 can protect the surface of ruthenium metal used as the first conducting layer 110 from undesired materials such as oxygen in the ambient environment during the wait time before further processing occurs or during preparations for further processing.

Other embodiments of the present invention are provided by a conductor structure of FIG. 1C, wherein the substrate 100 comprises, in some embodiments, an integrated circuit wafer that has completed fabrication through the step of contact formation and is ready for application of conductors for the purpose of electrically interconnecting individual integrated circuit components. The first conducting layer 110 applied on the substrate comprises ruthenium metal in some embodiments. Selective passivation layer 120 comprises a thin layer (~1 monolayer) of iodine applied on the first conducting layer in some embodiments. In some embodiments, second conducting layer 130 is copper applied by electrodeposition. In some embodiments, the iodine selective passivating layer 120 can protect the surface of the copper metal used as the second conducting layer 130 from detrimental materials such as oxygen in the ambient environment during wait time or preparation for further processing or during continued deposition of material comprising second conducting layer 130.

Methods for creating a conducting structure according to some embodiments of the present invention first comprise the step of providing a substrate. These methods comprise the further step of depositing a first conducting layer on an exposed surface of the substrate. Further, these methods comprise the step of applying a selective passivating layer to an exposed surface of the first conducting layer. In addition, these methods comprise the step of depositing a second conducting layer such that the first conducting layer and the selective passivation layer act as a base for deposition of the second conducting layer, wherein the selective passivation layer is displaced by the second conducting layer and remains as a passivating layer on the exposed surface of the second conducting layer being deposited.

In some embodiments of these methods, the substrate material comprises an integrated circuit wafer that has completed fabrication through the step of contact formation and is ready for application of conductors for the purpose of electrically interconnecting individual integrated circuit components. In some embodiments, the first conducting layer comprises ruthenium deposited by chemical vapor deposition and/or electroless deposition, the selective passivating layer comprises a thin (~1 monolayer) of iodine deposited by backfill of the deposition chamber with molecular iodine vapor after deposition of the first conducting layer comprising ruthenium is complete and before exposing the deposited first conducting layer of ruthenium to other gasses that might create surface contamination layers such as oxides or hydroxides on the surface of the first conducting ruthenium layer, and the second conducting layer comprises copper deposited by electrodeposition. The presence of the selective passivation layer comprising iodine can reduce or inhibit the incorporation of undesirable materials such as oxides and hydroxides at the interface between the first conducting layer comprising ruthenium and the growing second conducting layer comprising copper, as well as reducing or inhibiting the growth of oxide on the surface of the growing copper second conducting layer. Additionally, the presence of the iodine selective passivation layer can continue to reduce or inhibit the oxide/hydroxide layer from growth on the copper second conducting layer during subsequent exposure to ambient air or other process steps after the electrodeposition step is complete.

An example of detailed process sequence that allows the formation of an iodine selective passivation layer according to some embodiments of the invention is deposition of the first conducting layer comprising ruthenium on a $SiO_2$ substrate by chemical vapor deposition, the formation of the iodine selective passivation layer by backfill of the sputtering chamber with iodine vapor to a pressure of approximately $10^{-6}$ Torr for 5 minutes or longer so as to reach a minimum exposure of 300 Langmuir and at room temperature (~300 degrees K.) before the system is opened to the air ambient, then transferring the substrate in room air ambient to a copper second conducting layer electrodeposition chamber within 15 minutes, and then electrodepositing the copper second conducting layer. Those skilled in the art may recognize many other applications where the conductor structures and methods disclosed herein are beneficial and may be applied to applications other than integrated circuits, and circuit boards as described herein.

Figure 2A:
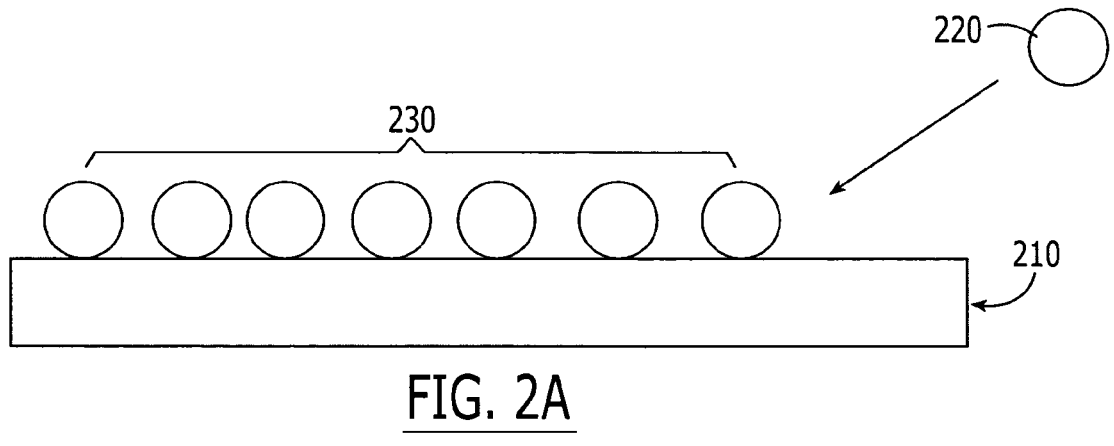
FIGS. 2A and 2B are cross-sectional views of conductor structures according to various embodiments of the present invention during intermediate fabrication steps according to various embodiments of the present invention.
Figure 2B:
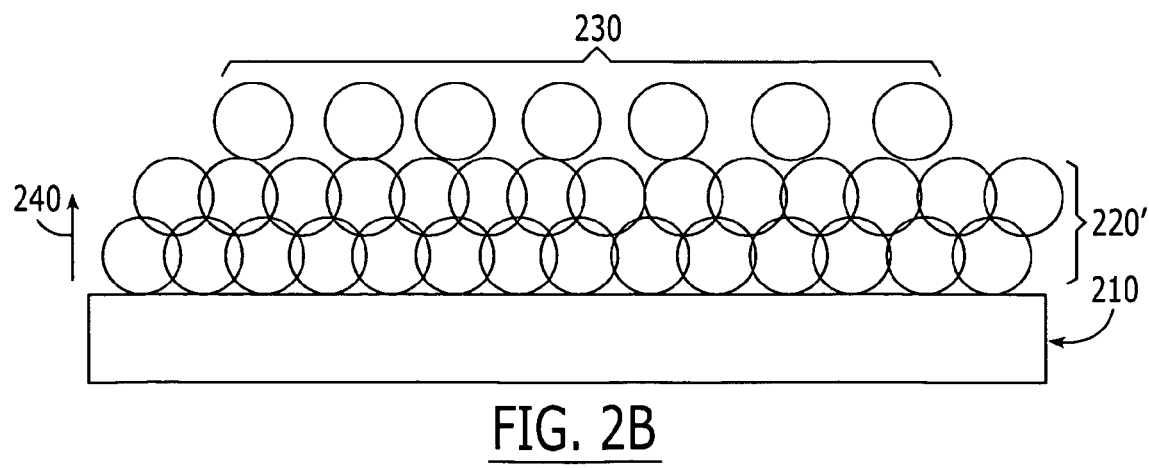

FIGS. 2A and 2B are cross-sectional views of conductive structures according to various embodiments of the present invention during intermediate fabrication steps according to various embodiments of the present invention. As shown in FIG. 2A, a first material 230 that is penetrable by a second conductor 220 relative to at least a second material other than the second conductor 220, is provided on a first conductor 210. In some embodiments, the first conductor 210 comprises a platinum group metal, the first material 230 comprises a halogen, the second conductor 220 comprises a metal, and the second material comprises oxygen. In other embodiments, the first conductor 210 comprises ruthenium, the first material 230 comprises iodine, the second conductor 220 comprises copper, and the second material comprises oxygen. In some embodiments, the first material 230 comprises about one monolayer of the first material, such as about one monolayer of iodine. The first material 230 can provide a selective passivation layer, as was already described, in some embodiments of the present invention.

Referring now to FIG. 2B, a plurality of atomic layers 220' of the second conductor 220 is deposited on the first conductor 210 having the first material 230 thereon, such that the first material 230 is displaced through the plurality of atomic layers 220' of the second conductor 220 during the depositing, as shown by arrow 240, to provide the first material 230 on the plurality of atomic layers 220' of the second conductor 220, remote from the first layer 210. In some embodiments, operations of FIG. 2B are performed by electrodepositing a plurality of atomic layers 220' of the second conductor 220 on the first conductor 210 having the first material 230 thereon. It will be understood that the first conductor 210 may be provided on a substrate, such as an integrated circuit wafer, as was already described extensively above.

Referring again to FIG. 2B, conductive structures according to some embodiments of the present invention comprise a first conductor 210, a plurality of atomic layers 220' of second conductor 220 directly on the first conductor 210, and a first material 230 directly on the plurality of atomic layers 220' of the second conductor 220, remote from the first conductor 210, the first material 230 being penetrable by the plurality of atomic layers 220' of the second conductor 220 relative to at least a second material other than the second conductor 220. In some embodiments, the first conductor 210 comprises a platinum group metal, the first material 230 comprises a halogen, the second conductor 220 comprises a metal, and the second material comprises oxygen. In other embodiments, the first layer 210 comprises ruthenium, the second layer 220 comprises a plurality of atomic layers of copper, and the third layer 230 comprises iodine, for example about one monolayer of iodine.

Additional discussion of various embodiments of the present invention now will be provided. This discussion includes various examples which shall not be viewed as limiting the scope of the present invention. As will be described below, X-ray photoelectron spectroscopy (XPS), low energy electron diffraction (LEED) and cyclic voltammetry (CV) have been used to study the adsorption of iodine on the Ru(0001), air and water exposure to both clean and iodine covered Ru(0001) surfaces and the stability of the iodine ad-layer during Cu overpotential electrodeposition. A Ru(0001)-($\sqrt{3}\times\sqrt{3}$)R30°-I structure was observed after $I_2$ vapor exposure of the Ru(0001) surface at room temperature. The Ru(0001)-($\sqrt{3}\times\sqrt{3}$)R30°-I structure was found to be stable toward ambient air and water exposure. The I ad-layer passivates the Ru(0001) surface against significant hydroxide, chemisorbed oxygen or oxide formation during exposure to air. Immersion of I-Ru(0001) results in greater hydroxide and chemisorbed oxygen formation than air exposure. A saturation coverage of I on a Ru(poly) electrode similarly passivated the Ru surface against oxidation upon exposure to water vapor over an electrochemical cell in a UHV-electrochemistry transfer system. Studies with combined electrochemical and XPS techniques show that the iodine surface ad-layer remained on top of the surface after cycles of overpotential electrodeposition/dissolution of copper on Ru(0001). These results indicate the potential bifunctionality of an iodine layer to both passivate the Ru surface in the microelectronic processing and to act as a surfactant for copper electrodeposition.

More specifically, the ability to passivate metallic surfaces under non-Ultra High Vacuum (UHV) conditions is not only of fundamental interest, but also may be of growing practical importance in catalysis and microelectronics. The catalytic properties of Ru have led to study of the reactivity of Ru surfaces in vapor and solution environments, as described, for example, in M. Nakamura and M. Ito, *Chem. Phys. Lett.*, 325, 293 (2000); H. Shi and K. Jacobi, *Surf. Sci.*, 317, 45 (1994); and H. Kim et al., *Surf. Sci.*, 474, L203 (2001). In addition, there appears to be growing interest in this material as a barrier to Cu diffusion during the fabrication of Cu interconnects for microelectronics applications, as described, for example, in O. Chyan et al., *J. Electrochem. Soc.*, 150, C347 (2003). As the feature size of semiconductor devices keeps on shrinking, currently used diffusion barriers, such as Ta or TaN, may become too thin to operate properly because of the consequent high resistivity, as described, for example, in K. M. Takahashi, *J. Electrochem. Soc.*, 147, 1414 (2000). Ruthenium may be a promising diffusion barrier candidate for the diffusion barrier for Cu interconnect fabrication in microdevices because of its high melting point (2310° C.), higher conductivity (7.6 µΩ-cm) and better resistance to oxidation in ambient than Ta. Ruthenium may be used alone, or may be formed on a layer comprising Ta, TaNx, W and/or WNx. The increasing interest in direct electrodeposition of Cu on the barrier without a vacuum-deposited seed layer, as described, for example, in C. Wang et al., *Electrochem. Solid-State Lett.*, 5, C82 (2002) and G. Oskam et al., *J. Electrochem. Soc.*, 146, 1436 (1999), may enhance the advantages of a barrier material which does not form an insulating interfacial oxide under conditions relevant to Cu plating. The potential use of Ru as a Cu diffusion barrier for microelectronics applications may enhance the desire for a method to passivate the surface against exposure to ambient during processing.

An iodine ad-layer on some semi-noble single crystal surfaces has been demonstrated to protect these surfaces from oxidation and contamination under ambient conditions, as described, for example, in A. Wieckowski et al., *Inorg. Chem.*, 23, 565 (1984); F. Lu et al., *J. Electroanal. Chem.*, 222, 305 (1987); A. T. Hubbard, *Chem. Rev.*, 88, 633 (1988); and G. A. Garwood, Jr. and A. T. Hubbard, *Surf. Sci.*, 121, L524 (1982). In addition to surface passivation, iodine ad-layers may have an additional benefit with respect to Cu electrodeposition, acting as a surfactant to enhance conformal Cu growth. A monolayer of adsorbed iodine has been described, for example, in E. S. Hwang, and J. Lee, *Electrochem. Solid-State Lett.*, 3, 138 (2000), to inhibit roughness evolution of MOCVD Cu films, and may therefore also serve as a surfactant during Cu electrodeposition. In such an application, iodine ad-atoms originally adsorbed at the electrode surface should not be buried by the deposited Cu film but remain on the surface of the Cu film during deposition (or etching). While this tendency has been demonstrated for Cu underpotential deposition on various electrodes, as described, for example, in A. Martinez-Ruiz et al., *Surf. Sci.*, 476, 139 (2001); J. L. Stickney et al., *J. Electrochem. Soc.*, 131, 260 (1984); and S. Chia-Haw, and Y. Shueh-Lin, *J. Phys. Chem. B*, 105, 5489 (2001), the stability of I ad-layers during Cu overpotential deposition does not appear to have been demonstrated. As is well known to those having skill in the art, underpotential deposition, is electrodeposition of a metal on a foreign metal at potentials less negative than the equilibrium potential of the deposition reaction. Such a process generally is energetically unfavorable, and may occur only because of a strong interaction between the two metals, with their interaction energy changing the overall energies to favorable. Consequently, only one monolayer generally can be deposited this way. In contrast, overpotential deposition may be used to deposit a plurality of monolayers of a metal on a foreign metal by electrodeposition, at potentials more negative than the equilibrium potential of the deposition reaction.

XPS and LEED results reported here appear to indicate that exposure of a Ru(0001) surface to $I_2$ vapor results in the formation of a $\sqrt{3}\times\sqrt{3}$ iodine (I-($\sqrt{3}\times\sqrt{3}$)) ad-layer that remains stable during exposure to air at 300 K, and can effectively passivate the surface against oxide formation. Similar XPS results were obtained for an I-Ru(poly) surface exposed to the $I_2$ vapor above an electrochemical cell in a UHV-electrochemistry (UHV-EC) transfer system. XPS and LEED show that iodine passivation is less pronounced upon Ru immersion in deionized water. Electrochemical and XPS measurements under UHV-EC conditions indicate that Cu electrodeposition on and dissolution from an I-modified Ru(poly) electrode in an I-free electrolyte does not result in a decrease of I surface coverage. The results indicate the potential for I ad-layers to both passivate Ru barrier surfaces during microelectronics processing and to act as a surfactant for Cu electrodeposition, according to some embodiments of the present invention.

The system used for Ru(0001) single crystal study included an ultra-high vacuum (UHV) chamber with a hemispherical electron energy analyzer (VSW, Cheshire, UK) for XPS and 3-grid LEED optics (Omicron, Germany), an unmonochromated x-ray source (Physical Electronics, Eden Prairie) and an ion gun (Specs, Germany) for sample cleaning. The UHV chamber was connected to an antechamber capable for sample loading, and the two chambers were separated by a gate valve. The pressures of the UHV chamber and the antechamber were maintained at $<5\times10^{-10}$ Torr and $<1\times10^{-7}$ Torr, respectively, by two different turbo molecular pumps. Pressures were monitored by nude ion gauges out of line of site with the sample, and calibrated for $N_2$. The temperature of the sample in the main chamber could be varied between 120K and 1300K by a combination of resistive heating and liquid nitrogen cooling. Sample temperature was monitored by a type K thermocouple spot-welded to the sample holder. LEED spectra were acquired with a beam energy of 71.4 eV. XPS spectra were acquired in constant pass energy mode (22 eV) using an Mg Kα x-ray source operated at 300W. Spectra were acquired with the analyzer axis parallel to the sample normal. XPS spectral analysis procedures were as previously reported, for example, in T. C. Lin et al., *Langmuir*, 14, 3673 (1998). Briefly, Peak fitting of the XPS spectra was accomplished using commercially available software, ESCA tools, which was utilized as a toolbox in the MATLAB environment. Shirley background subtraction was used in this study due to its effectiveness for fitting the short energy range found in typical core XPS spectra, as described, for example, in P. M. A. Sherwood, *J. Vac. Sci. Technol.*, A, 14, 1424 (1996). The experimental O(1s) spectra was fitted with components of a full width at half maxima (FWHM) of 1.7 eV. This FWHM was used to fit the O(1s) spectra since pure $Sio_2$ results in a O(1s) spectra of single peak with FWHM of 1.7 eV under same analysis conditions. The binding energies of synthesized O(1s) spectral components were allowed to vary by $<\pm0.1$ eV throughout the fitting procedure.

The exposure studies on Ru (poly) and electrochemical studies on Ru(0001) were carried out in a system designed for transfer between UHV and electrochemical environments without sample exposure to atmosphere. A detailed description of this system and the method for performing electrochemical experiments is reported, for example, in T. C. Lin et al., *Langmuir*, 14, 3673 (1998); G. Seshadri et al., *J. Electrochem. Soc.*, 146, 1762 (1999); and G. Seshadri et al., *Corros. Sci.*, 39, 987 (1997). Briefly, however, the main chamber was equipped with a hemispherical analyzer and unmonochromated x-ray source, and with facilities for ion bombardment and sample heating/cooling. XPS acquisition and analysis procedures were similar to those used in the other chamber.

The Ru(0001) surface was cleaned by cycles of Argon ion sputtering(3 keV, 10 μA) at 1000K for 4.5 hours followed by another 30 min annealing at 1100K. The cleanness of the surface was checked by LEED, as described, for example, in J. T. Grant, and T. W. Haas, *Surf. Sci.*, 21, 76 (1970), and by XPS. XPS analysis of Ru is complicated by the overlap between the C(1s) and Ru($3d_{3/2}$) transitions. Therefore the Ru($3d_{5/2}$)/Ru($3d_{3/2}$) intensity ratio was compared to literature values, for example, J. R. Moulder et al., *Handbook of X-ray Photoelectron Spectroscopy*, Physical Electronics, Eden Prairie, Minn., (1995), as a measure of surface cleanliness—a method previously used for the analysis of Ru thin films, as described, for example, in K. C. Smith, Y.-M. Sun, N. R. Mettlach, R. L. Hance, and J. M. White, *Thin Solid Films*, 376, 73 (2000). The XPS spectra were referenced to Ru($3d_{5/2}$) binding energy of 280.1 eV for a clean Ru surface, as described, for example, in J. R. Moulder et al., *Handbook of X-ray Photoelectron Spectroscopy*, Physical Electronics, Eden Prairie, Minn., (1995). The cleaning of Ru(poly) was performed under a similar procedure as for Ru(0001) and the cleanness of the surface was also similarly monitored by XPS.

A surface iodine layer on Ru(0001) for electrochemical studies was prepared by immersion of a clean Ru(0001) sample into a 0.1 M $HClO_4$ solution with 5 mM KI and polarization at a potential of −0.6V (vs. RHE) for 40 min., as described, for example, in P.-C. Lu et al., *Langmuir*, 18, 754 (2002). In the studies of adsorption behavior of iodine on Ru(0001) and in the exposure experiments, a surface iodine layer was prepared by sample exposure to $I_2$ vapor. The molecular iodine was produced by sublimation from solid iodine (99.999% in purity, Strem Chemicals) and introduced into the UHV main chamber as vapor through a retractable, stainless steel tubular doser. The iodine vapor pressure in UHV chamber was maintained at $5\times10^{-8}$ Torr during dosing through a manual leak valve. $I_2$ exposures are reported here in terms of Langmuir (L)(1L=$10^{-6}$ Torr-sec) and have not been corrected for ion gauge sensitivity or flux to the sample. The iodine coverage was monitored by XPS and calculated from the intensity ratio of I($3d_{5/2}$)/Ru($3d_{5/2}$) peaks by the following equation for fractional monolayer coverage, θ, as described, for example, in M. P. Seah, *Practical Surface Analysis*, Wiley, N.Y., (1990):

$$\frac{\theta_A\{1-\exp[-a_A/\lambda_A(E_A)]\}}{1-\theta_A\{1-\exp[-a_A/\lambda_B(E_B)]\}}=\frac{N_A}{N_B} \quad (1)$$

where $\theta_A$ is the iodine coverage and $\alpha_A$ is the covalent diameter of the iodine atom (~2.66 Å), $N_A$ and $N_B$ are the atomic concentrations of the iodine overlayer and Ru substrate, respectively, $\lambda_A$ and $\lambda_B$ are the inelastic mean free paths (IMFP) for iodine and ruthenium, and $E_A$ and $E_B$ represent the XPS electron energy for $I(3d_{5/2})$ and $Ru(3d_{5/2})$ electrons respectively. The calculated IMFP of $Ru(3d_{5/2})$ electrons in elemental Ru is $\lambda_B$=14.1 Å and IMFP of $I(3d_{5/2})$ in element I is $\lambda_A$=16.3 Å, as described, for example, in S. Tanuma et al., *Surf. Interface Anal.*, 21, 165 (1994).

A saturated iodine layer was formed on both Ru(0001) or Ru(poly) to prepare an iodine covered surface for the exposure experiments. In the clean Ru(000 1) and I-Ru(0001) air exposure experiments, the prepared and characterized sample was transferred from UHV into the antechamber, which was then isolated via the gate valve. The antechamber was then opened to atmosphere for 30 min. For the water exposure, the Ru(0001) or I-Ru(0001) sample was transferred out of the UHV system and drops of deionized water was applied onto the surface for 5 min. The sample was then dried by nitrogen gas and transferred back into the UHV system for analysis. The Ru(poly) or I-Ru(poly) sample surface was exposed to the water vapor from the electrochemical cell, 2 cm away, for 30 min for the water vapor experiments, or contacted the water meniscus of the electrochemical cell for 5 min for the water immersion studies.

The thickness of the oxide overlayer (d) formed after exposure was estimated by the following equation, as described, for example, in M. P. Seah, *Practical Surface Analysis*, Wiley, N.Y., (1990) and P. J. Cumpson, and M. P. Seah, *Surf. Interface Anal.*, 25, 430 (1997):

$$\frac{\{1-\exp[-d/\lambda_A(E_A)]\}}{\exp[-d/\lambda_B(E_B)]}=\frac{N_A}{N_B} \quad (2)$$

where $N_A$ and $N_B$ are the atomic concentrations of the oxygen overlayer and Ru substrate, respectively, and $E_A$ and $E_B$ represent the XPS electron energy for O(1s) and $Ru(3d_{5/2})$ electrons, $\lambda_A$ and $\lambda_B$ are the inelastic mean free path(IMFP) for oxygen and ruthenium, respectively. The calculated IMFP of $Ru(3d_{5/2})$ electrons in element Ru is $\lambda_B$=14.1 Å, as described, for example, in S. Tanuma et al., *Surf. Interface Anal.*, 21, 165 (1994). In order to estimate the IMFP of O(1s) electrons in the oxygen overlayer, the overlayer composition is assumed to be $RuO_2$ and the calculated, as described, for example, in S. Tanuma et al., *Surf. Interface Anal.*, 21, 165 (1994), IMFP is 15.1 Å.

Figure 3:
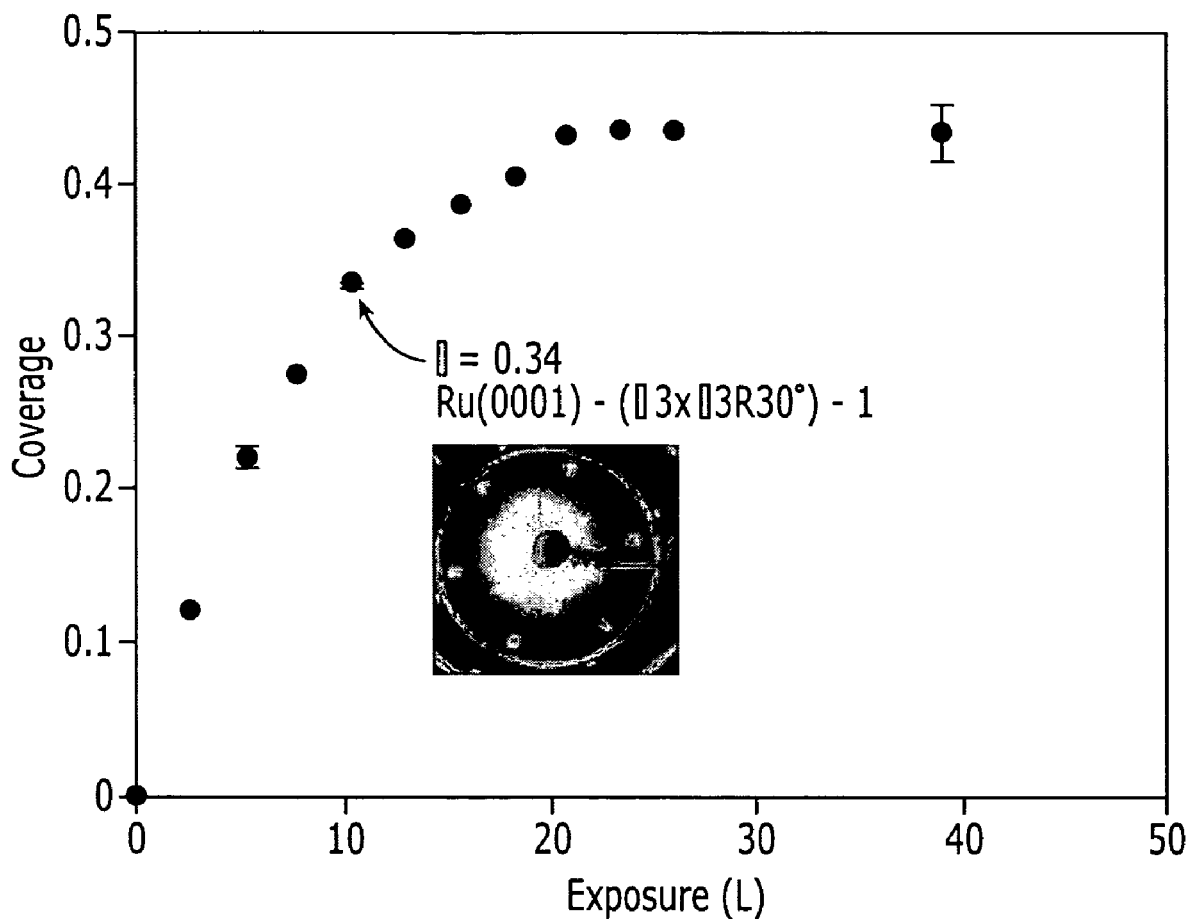
FIG. 3 is an Iodine uptake curve on clean Ru(0001) at room temperature, wherein a bright Ru(0001)-($\sqrt{3}\times\sqrt{3}$)R30°-I structure was formed after 10.4L iodine dosing ($\theta$=0.34), according to embodiments of the present invention.

FIG. 3 shows the variation of XPS-derived I surface coverage vs $I_2$-exposure for adsorption on clean Ru(0001) at 300K. The iodine displayed a rapid uptake on the surface at low coverages, and approached saturation at higher coverages. A saturation coverage of 0.44 ML was observed after exposure of 39L $I_2$. During the exposure process, LEED was employed to monitor the ordering of iodine on the surface. A faint $(\sqrt{3}\times\sqrt{3})$ R30°-I superlattice pattern developed with increasing $I_2$ exposure. A bright, but not very sharp, LEED pattern was observed after 10.4L $I_2$ exposure (FIG. 3). The surface coverage at this point was estimated (eq. 1) to be about 0.34 ML, close to the theoretical surface coverage of ⅓ ML of iodine for $(\sqrt{3}\times\sqrt{3})$ R30° structure formation. Further incorporation of iodine during the build-up of the adsorbate layer introduced disorder into this superstructure and finally blurred the pattern from the Ru(0001) substrate after 39L iodine exposure.

Sharp and bright $\sqrt{3}\times\sqrt{3}$ R30° patterns were observed upon annealing the iodine saturated Ru(0001) single crystal for 5 min. at 400K or 500K in UHV. The superlattice structure disappeared completely after annealing at 700K for 5 min.

Figure 4A:
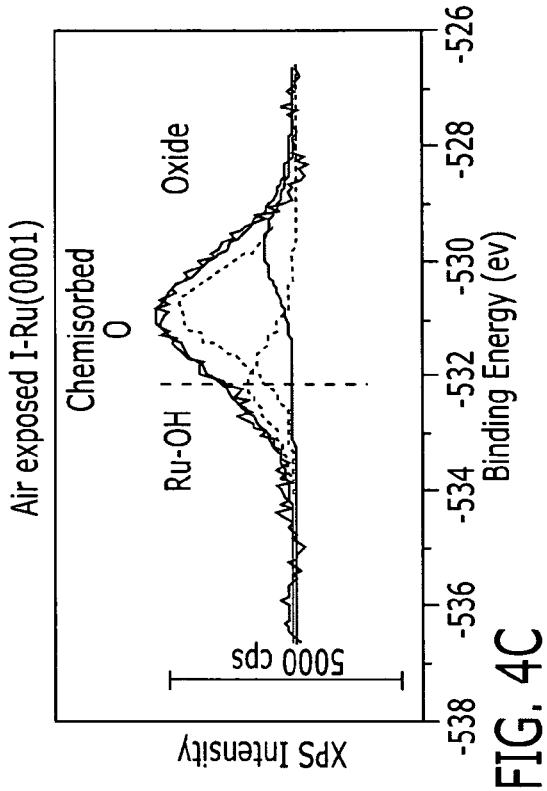
FIGS. 4A-4D illustrate XPS O(1s) spectra after air exposure to iodine covered Ru(0001) (FIG. 4A) and clean Ru(0001) (FIG. 4B) and after further liquid water exposure to iodine covered Ru(0001) (FIG. 4C) and clean Ru(0001) (FIG. 4D), according to embodiments of the present invention.
Figure 4C:
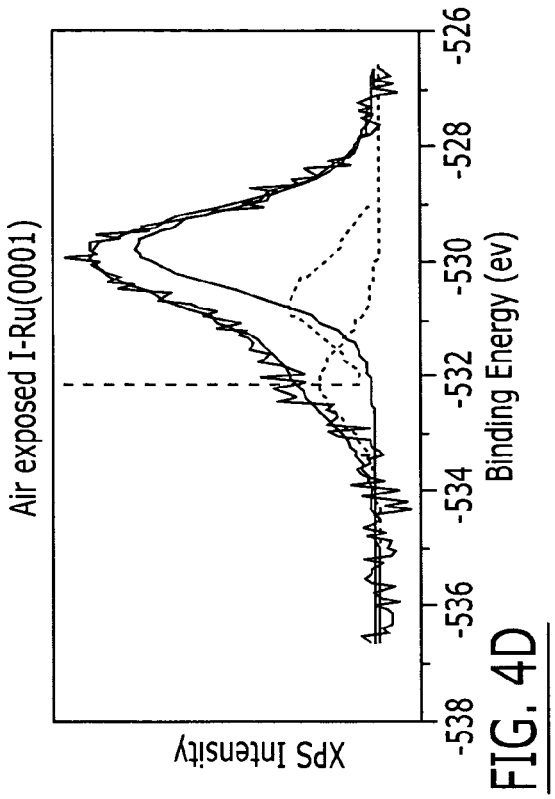
Figure 4B:
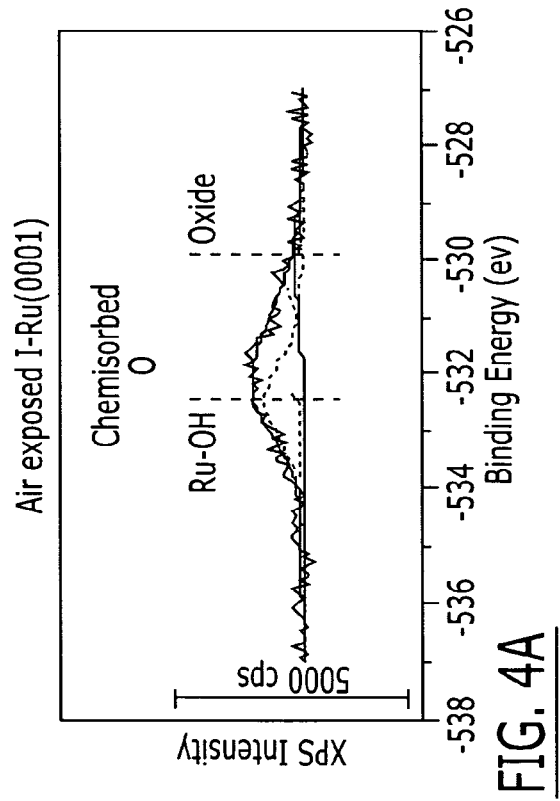

FIGS. 4A-4B show the comparison of O(1s) core level spectra between clean and I-Ru(000 1) surfaces after exposure to air for 30 min. Both experimental O(1s) spectra are well fit with three components, each with a FWHM of 1.7 eV at binding energies of 530.0 eV, ~531.1 eV and 531.6 eV. The components at 530.0 eV, 531.1 ev and 532.5 eV are assigned, respectively, to $RuO_2$, as described, for example, in S. Bhaskar et al., *J. Appl. Phys.*, 89, 2987 (2001); H. Y. H. Chan et al., *J. Catal.*, 172, 336 (1997); and J. Y. Shen et al., *Appl. Surf. Sci.*, 51, 47 (1991), chemisorbed oxygen, as described, for example, in S. Bhaskar et al., *J. Appl. Phys.*, 89, 2987 (2001); H. Y. H. Chan et al., *J. Catal.*, 172, 336 (1997) and hydroxide, as described, for example, in H. Madhavaram et al., *Journal of Catal.*, 202, 296 (2001), by comparison with results in the literature. The hydroxide and chemisorbed oxygen features are the major components of the O(1s) spectrum on I-Ru(0001). In contrast, oxide is the dominant component for the air exposed clean Ru(0001) O(1s) spectrum. The thickness of the oxide layer was estimated (eq. 2) to be 1.8 Å for air-exposed Ru(0001), and 0.07 Å for I-Ru(0001), receptively. The Intensity ratios of O(1s)/Ru(3 $d_{5/2}$) for components in the experimental O(1s) spectra and the estimated oxide thickness are summarized in Table 1. The pronounced difference in the oxide layer thickness after air exposure indicates that the iodine ad-layer passivates the substrate surface and inhibits the formation of oxide on it when exposed to ambient.

Figure 4D:
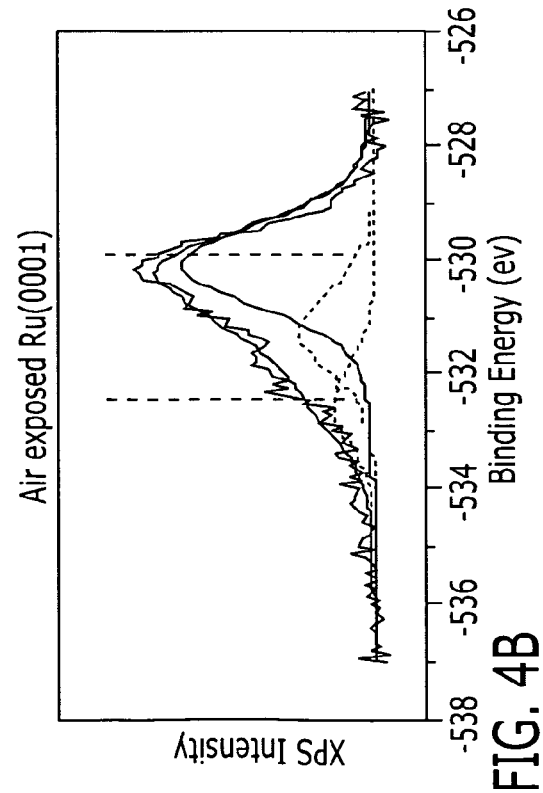
Figure 5A:
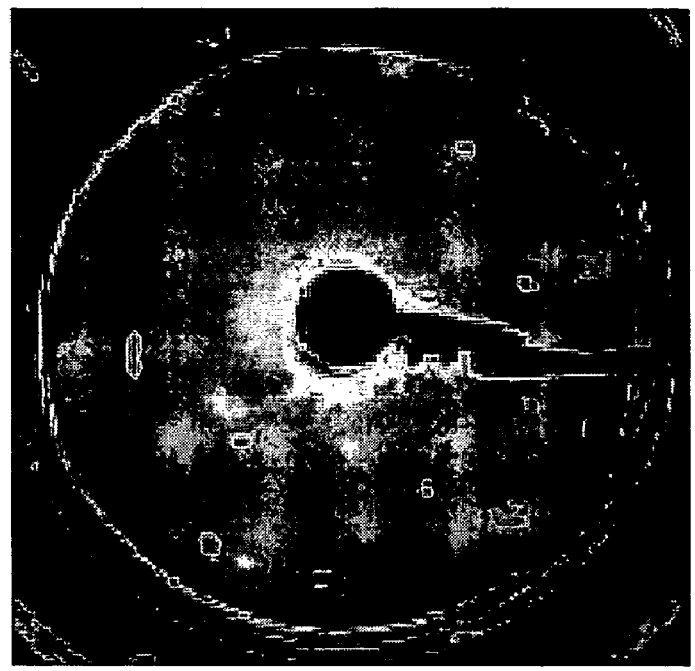
FIGS. 5A-5B illustrates Ru(0001)-($\sqrt{3}\times\sqrt{3}$)R30°-I stability toward exposure to air and water, where Ru(0001)-($\sqrt{3}\times\sqrt{3}$)R30°-I pattern was taken after air exposure (FIG. 5A), and after air exposure followed by water(liquid) exposure (FIG. 5B), with beam energy of 71.4 ev, according to embodiments of the present invention.
Figure 5B:
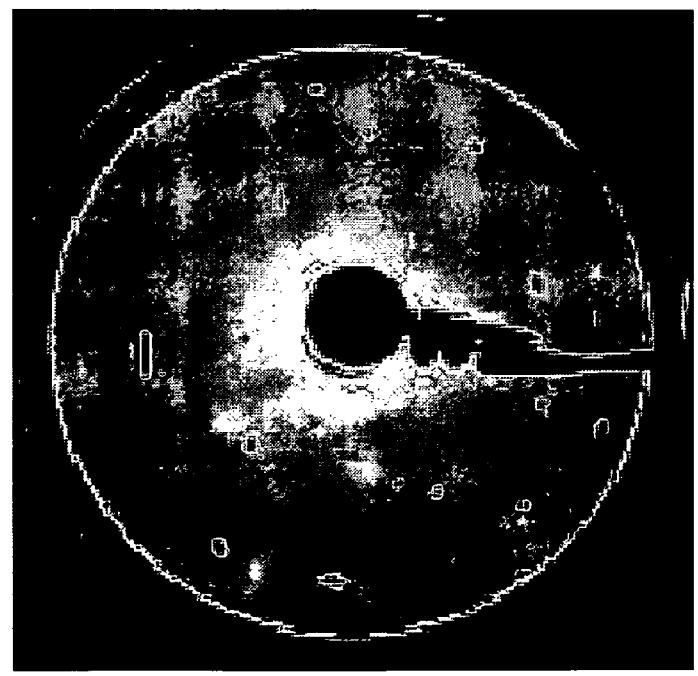

The formed Ru(0001)-$(\sqrt{3}\times\sqrt{-3})$R30°-I structure was stable not only toward exposure to air but also toward immersion in water (FIGS. 5A-5B). The stability of adsorbed iodine toward water exposure, as demonstrated by LEED (FIG. 5B), would lead to an expectation of same strong inhibition of oxygen ad-layer formation in water exposure as in air exposure. However, when such air-exposed surfaces were further exposed to deionized water, the difference in the resulting O(1s) spectra of two surfaces is less pronounced, as shown in FIGS. 4C and 4D. These O(1s) spectra are fit with three components, each with a FWHM of 1.7 eV at binding energies of 530.1 eV, ~531.1 eV and 532.5 eV, which was also assigned to oxide, chemisorbed oxygen and hydroxide respectively. The estimated thickness of oxide overlayers are 0.3 Å for I-Ru(0001) surface and 2.2 Å for uncovered Ru(0001) surface, indicating a less pronounced iodine passivation for the surface toward interaction with liquid water.

Figure 6A:
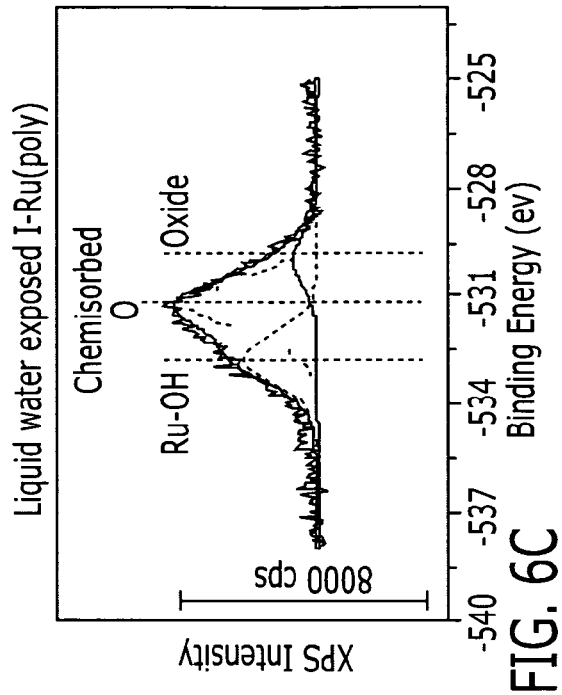
FIGS. 6A-6D illustrate XPS O(1s) spectra after water vapor exposure to iodine covered Ru(poly) (FIG. 6A) and clean Ru(poly) (FIG. 6B) and after further liquid water exposure to iodine covered Ru(poly) (FIG. 6C) and clean Ru(poly) (FIG. 6D), according to embodiments of the present invention.
Figure 6B:
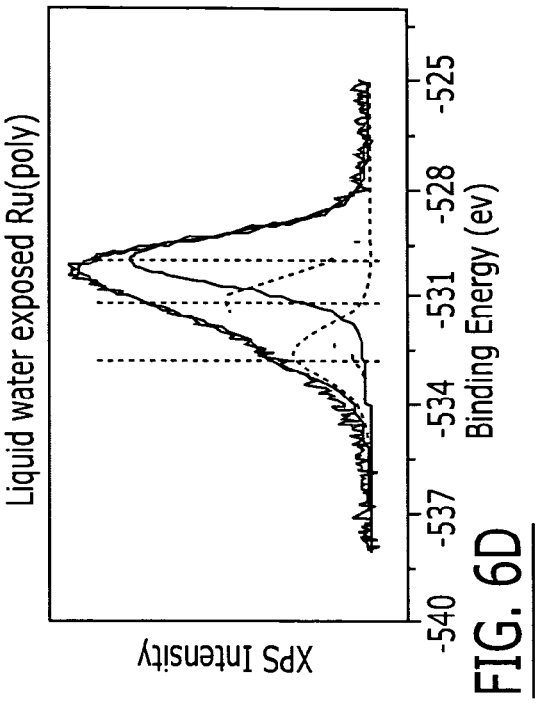
Figure 6C:
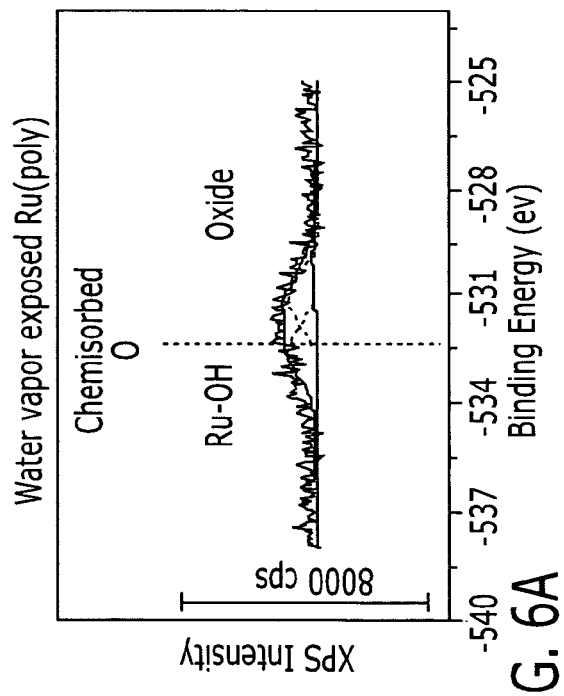
Figure 6D:
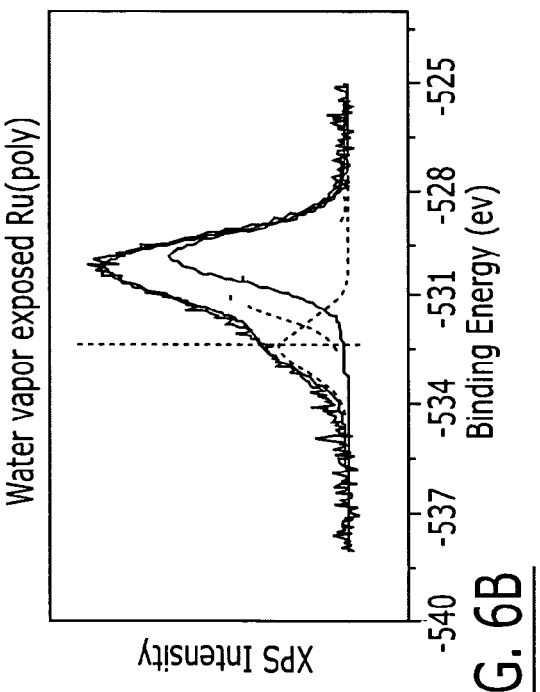

A similar passivation effect of a surface iodine layer was also observed on Ru(poly). FIGS. 6A-6B show the XPS O(1s) spectra after exposing the Ru(poly) surface and the I-Ru(poly) surface to water vapor above an electrochemical cell. Both O(1s) core level spectra are similar to those from the Ru(0001) air-exposure experiments (FIGS. 4A-4D). In each case the spectrum can also be well fit with three components with a FWHM of 1.7 eV at binding energies of 530.0 eV, 531.1 eV and 532.5 eV which are similarly assigned to the oxide, chemisorbed oxygen and Ru hydroxide bonds, respectively (Table 1). The pronounced difference in the intensities of peaks at 530.0 eV appears to clearly demonstrate the inhibition effect of a surface iodine ad-layer toward the oxide formation when exposed to water vapor. The estimated thicknesses of oxide layer are 0.1 Å and 3.4 Å for I-Ru(poly) and clean Ru(poly), respectively. FIGS. 6C-6D show the XPS O(1s) spectra acquired for the above water-vapor exposed samples after subsequent exposure to liquid water. The O(1s) spectra in both I-Ru(poly) and clean Ru(poly) are similarly fit as that for water-vapor exposed samples (Table 1). The components at binding energies of 530.0 eV, ~531.1 eV and ~532.5 eV are also assigned to the $RuO_2$, chemisorbed oxygen and Ru hydroxide bonds, respectively. The I-Ru(poly) surface formed a thicker oxide layer when exposed to liquid water than exposed only to water vapor, but the thickness is still smaller than that observed for the clean Ru(poly) surface exposed to liquid water. The estimated thicknesses of the oxide overlayers are 0.6 Å and 4.4 Å for I-Ru(poly) and clean Ru(poly), respectively. The results appear to show an effective but limited passivation effect of iodine ad-layer on the Ru(poly) surface toward liquid water exposure.

After the cleaning of Ru(0001) in the UHV-EC chamber, another 2 hours annealing at 850K was conducted on the Ru(0001) sample in order to achieve a well-ordered surface before the electrochemical experiments. The surface iodine layer was deposited on well-annealed Ru(0001) electrochemically before the copper deposition process, with an estimated coverage of 0.25 ML from XPS (eq. 1).

Figure 7:
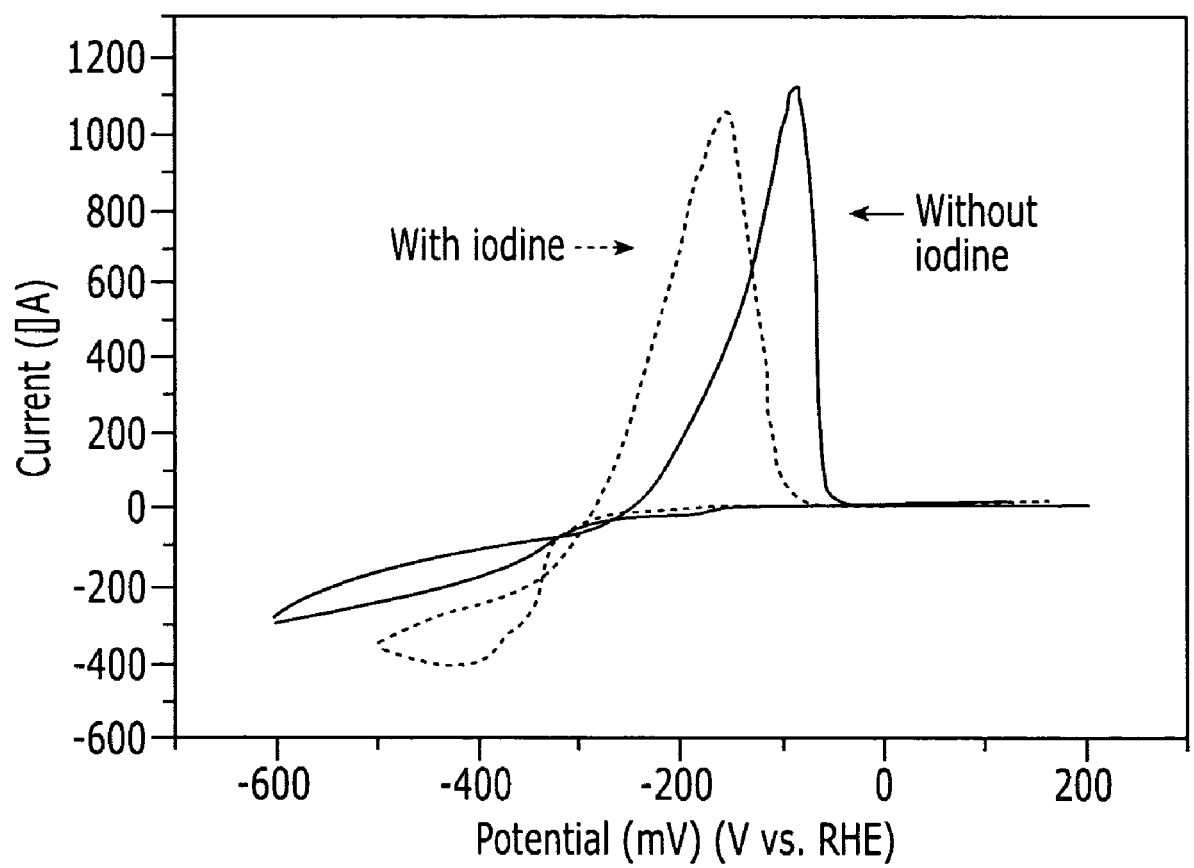
FIG. 7 illustrates Cyclic Voltammograms for Cu electrodeposition on I/Ru(0001) or clean Ru(0001) in 0.1M HCO$_4$ solution with 5 mM Cu(ClO$_4$)$_2$ at scan rate 10 mV/s, according to embodiments of the present invention.

FIG. 7 shows the CV observed for clean and I-Ru(0001) electrodes immersed in a 5 mM $Cu(ClO_4)_2$ solution with 0.1 M $HClO_4$ supporting electrolyte. The iodine modified sample was scanned from OCP to −0.5 V vs. RHE and then reversed to anodic sweep and back to OCP. A similar scan procedure was applied to the unmodified Ru(0001) sample but the negative potential limit was extended to −0.6 V vs. RHE. As shown in FIG. 7, the iodine modification has a pronounced effect on the Cu electrodeposition process. With iodine modification, the anodic peak potential shifts about 0.07 V more negative, indicating an energetically more favorable anodic process. In the cathodic sweep on the unmodified Ru(0001), the deposition take places over a wide potential range without distinct peak formation, since $H_2$ evolution overlaps the Cu deposition region. In contrast, a wave at −0.42 V is noticeable on I/Ru(0001).

Figure 8A:
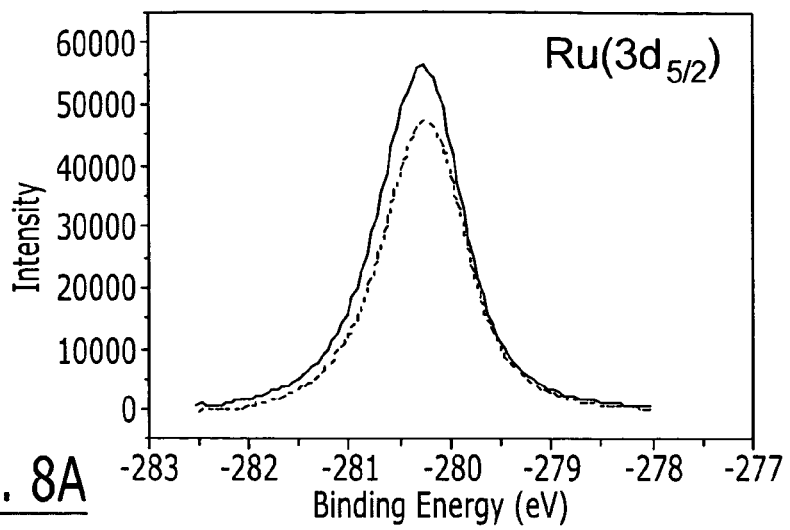
FIGS. 8A-8E illustrate XPS spectra after iodine adsorption (solid line) on Ru(0001) and after subsequent Cu electrodeposition (dotted line) on I/Ru(0001), according to embodiments of the present invention.
Figure 8B:
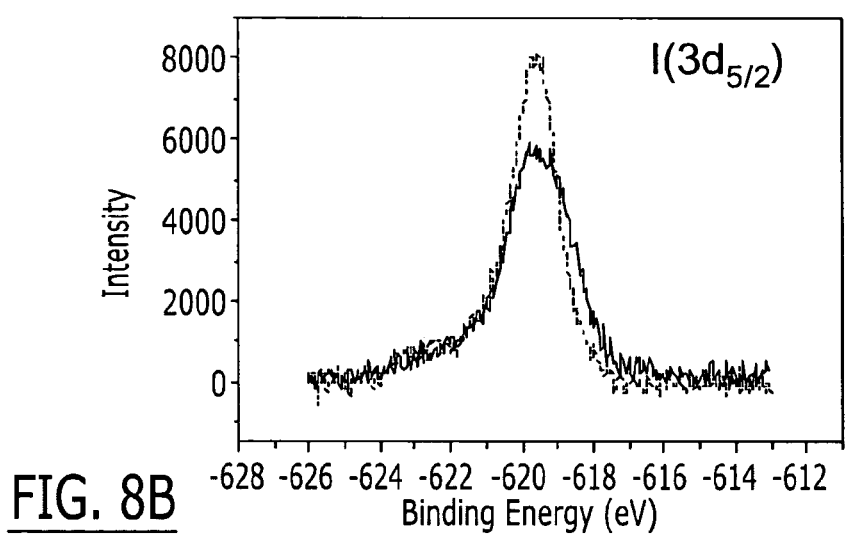
Figure 8C:
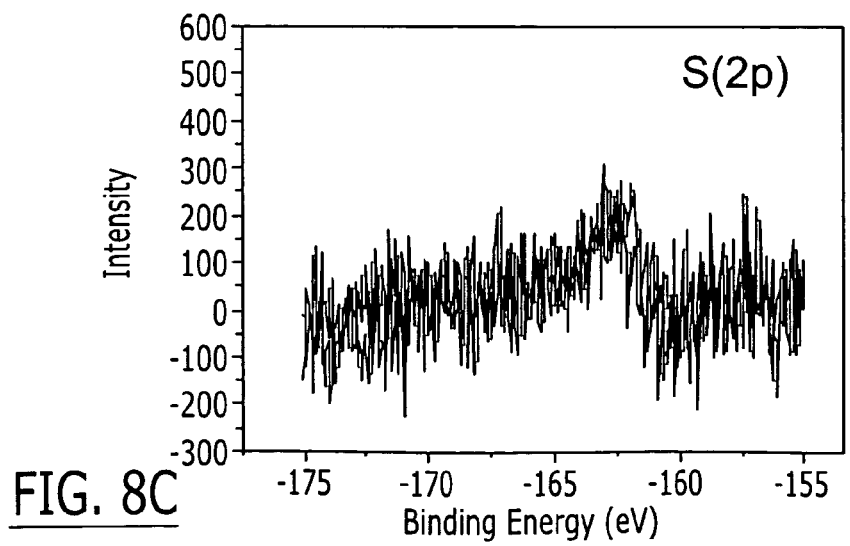
Figure 8D:
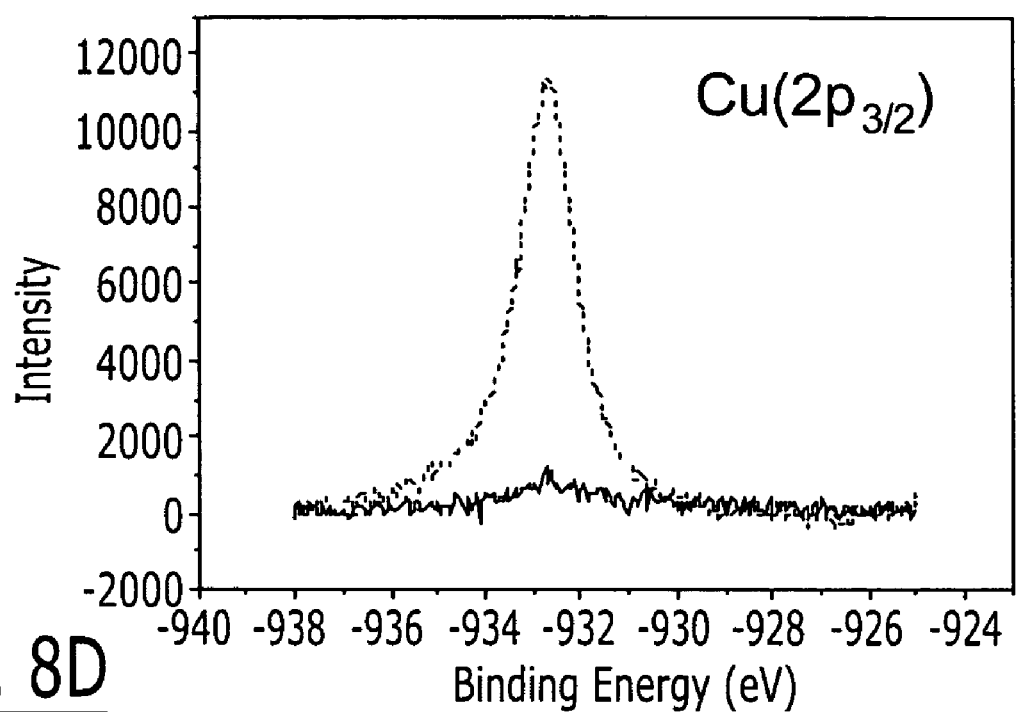
Figure 8E:
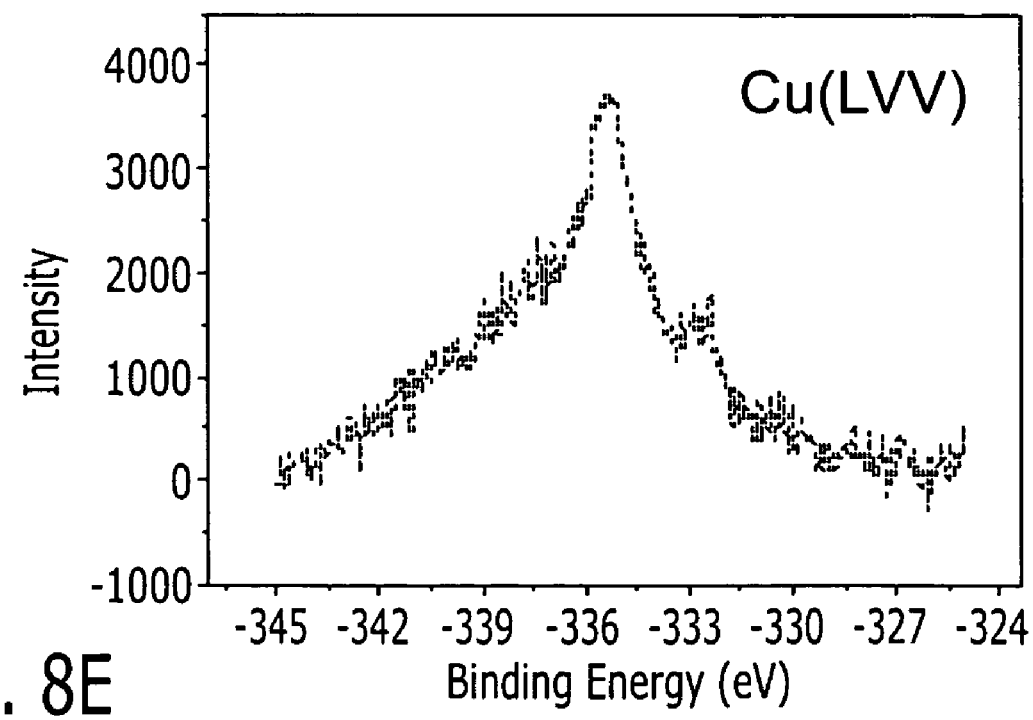
Figure 9:
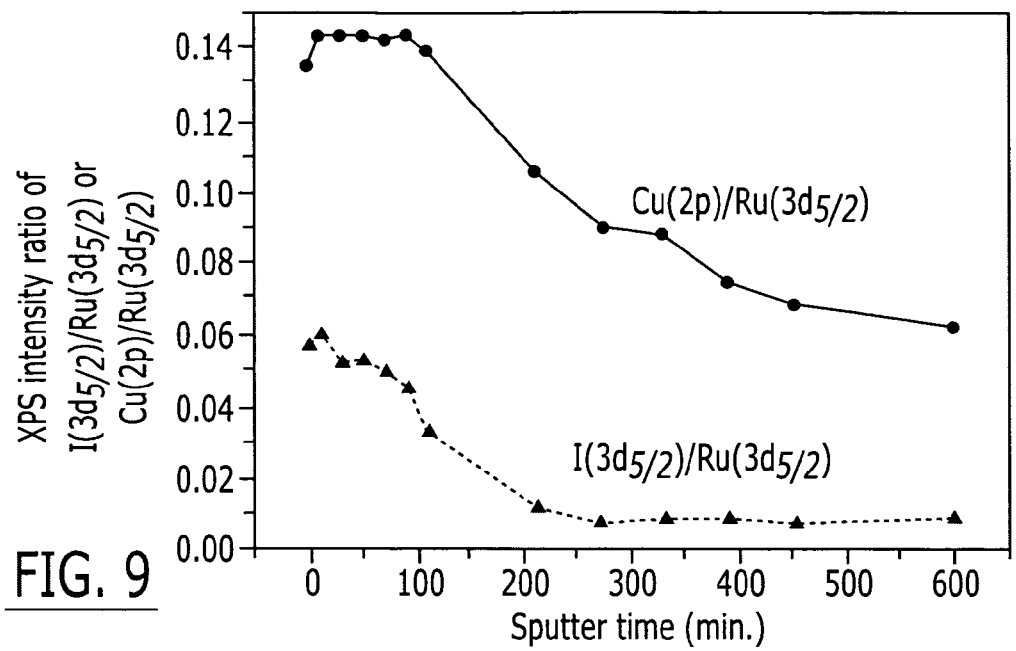
FIG. 9 illustrates a depth profile of Cu electrodeposited I/Ru(0001) sample, according to embodiments of the present invention.

XPS and x-ray excited Cu(LVV) Auger spectra of the I-Ru (0001) surface before and after Cu electrodeposition are shown in FIGS. 8A-8E. The XPS and Auger measurements were carried out after 4 CV cycles and one subsequent pulse experiment on the I-Ru(0001) sample, which was immersed at potential of −0.5 V. Identified with the Cu auger parameter, the deposited Cu is Cu metal (FIG. 8E). The sulfur contamination is negligible both before and after the deposition process as evidenced by the very weak XPS S(2p) spectra signals (FIG. 8C). The Ru spectra (FIG. 8A) intensity was attenuated by the deposited Cu layer after the electrodeposition process. In contrast, the intensity of $I(3d_{5/2})$ spectra was not attenuated (the slight increase indicates inhomogeneous coverage of the sample) (FIG. 8B). This result appears to demonstrate that surface iodine is not covered by the deposited Cu, but floats on top of the surface during the deposition process. This conclusion appears to be verified by the depth profile of the Cu electrodeposited I/Ru(0001) sample (FIG. 9). After about 250 min. argon sputtering, the XPS intensity ratio of $I(3d_{5/2})$/Ru $(3d_{5/2})$ become constant and close to null as shown in FIG. 9. The intensity ratio of $Cu(2p)/Ru(3d_{5/2})$ is, however, decreased by only about 30%. This result appears to indicate that iodine floats on top of the Cu layer surface as a surfactant during the electrodeposition.

LEED results (FIG. 3) appear to indicate that a $(\sqrt{3}\times\sqrt{3})$ R30°-I overlayer is formed by Ru(0001) exposure to $I_2$ at 300 K, and that this ad-layer becomes disordered at higher $I_2$ exposures. Similar disordering of a halogen ad-layer upon saturation exposure has been reported for $Br_2/Pt(111)$, as described, for example, in E. Bertel, K. Schwaha, and F. P. Netzer, *Surf. Sci.*, 83, 439 (1979), and for $I_2$/Fe—Cr—Ni (111), as described, for example, in G. A. Garwood, Jr., and A. T. Hubbard, *Surf. Sci.*, 121, L524 (1982). In the experiment reported here, mild annealing in vacuum restores the ordered ad-layer. XPS data (FIG. 4A, 4B; Table 1) and LEED (FIG. 5) appear to demonstrate that the ordered I ad-layer inhibits oxide and adsorbed oxygen formation on the Ru(0001) surface upon exposure to ambient at room temperature. A similar effect is observed for an I-modified polycrystalline electrode exposed to water vapor above an electrochemical cell (FIGS. 6A-6D). The ordered I ad-layer on the single crystal substrate will also survive immersion in water under open circuit conditions. While the surface is less completely passivated under such conditions, an inhibition of surface oxide formation relative to that of the unmodified Ru surface is still observed (FIGS. 4, 6A-6D; Table 1). These data appear to indicate the practical robustness of I-modification of Ru surfaces for passivation and electrochemical processing under industrial conditions.

The kinetic inhibition of $RuO_2$ formation on Ru(0001) upon exposure to $O_2$ at 300 K appears to be known, as described, for example, in M. Tanaka, and M. Ami, *J. Am. Ceram. Soc.*, 81, 2513(1998), and accounts for the limited oxide layer thickness observed for clean Ru(0001) exposed to room air, or air and liquid water (Table 1). This kinetic barrier is less apparent for polycrystalline surfaces, however, as demonstrated by the substantially thicker oxide formed on the polycrystalline as compared to a single crystal surface (Table 1). While a greater reactivity of the polycrystalline as compared to the close-packed single crystal surface is not surprising, there may be implications for the processing of Ru diffusion barriers during microelectronics fabrication, since such barrier surfaces are more likely to resemble the polycrystalline rather than the single crystal surface.

A detailed analysis of the interaction of the I-ad-layer with liquid water compared to combined $H_2O/O_2$ vapor (ambient air) may be complicated due to some uncertainty in the assignment of O(1s) features at Ru surfaces. There appears to be general consensus, as described, for example, in S. Bhaskar et al., *J. Appl. Phys.*, 89, 2987 (2001); H. Y. H. Chan et al., *J. Catal.*, 172, 336 (1997); and J. Y. Shen et al., *Appl. Surf. Sci.*, 51, 47 (1991), that an O(1s) binding energy near 530.0 eV on Ru is indicative of oxide formation—$RuO_2$. An O(1s) binding energy of ~532 eV (FIG. 2,4) has been attributed to a surface hydroxyl species, as described, for example, in H. Madhavaram et al., *Journal of Catal.*, 202, 296 (2001) and R. Koetz et al., *J. Electrochem. Soc.*, 130, 825 (1983), as well as to a chemisorbed O species, as described, for example, in H. Y. H. Chan et al., *J. Catal.*, 172, 336 (1997). The fact that exposure to $H_2O$ vapor results in features at both 532.5 eV and 531 eV, (FIGS. 6A-6D) motivates the assignment of the 532.5 eV feature to a surface OH species. An assignment of this feature to molecularly adsorbed water appears improbable due to the stability of this feature at 300 K in UHV on both clean and I-modified surfaces, and to the fact that molecularly adsorbed $H_2O$ dissociates on Ru well below room temperature as described, for example, in G. Pirug et al., *Surf. Sci.*, 241, 289 (1991). The assignment of the 532.5 eV feature to chemisorbed OH is further supported by the fact dissociative chemisorption and OH formation has been reported for both clean Ru(0001), as described, for example, in M. Nakamura, and M. Ito, *Chem. Phys. Lett.*, 325, 293 (2000) and P. J. Feibelman, *Science*, 295, 99 (2002), and Ru(0001) modified by chemisorbed oxygen, as described, for example, in M. Kiskinova et al., *Surf. Sci.*, 150, 319 (1985). Assignment of the 532.5 eV feature to OH then appears to indicate the most logical assignment of the 531 eV feature is to chemisorbed oxygen.

Given the O(1s) assignments in Table 1, inspection of the data for $H_2O$ vapor exposure to clean and I-modified Ru(poly) (FIGS. 6A, 6B; Table 1) indicates that the I overlayer inhibits complete $H_2O$ dissociation to form either chemisorbed O or $RuO_2$, although OH formation occurs. These results are consistent with those observed for I-Ru (0001) (FIGS. 4A, 4B; Table 1) and suggest that although the partial dissociation of $H_2O$ occurs on both clean and I-modified surfaces:

 (3)

the further dissociation of OH is inhibited by the I-ad-layer:

 (4)

Results for exposure to either $H_2O$ vapor or ambient appear to air differ significantly from the results observed for immersion in water solution (FIGS. 4C, 4D; FIGS. 6C, 6D; Table 1). Immersion in the liquid phase results in substantial $OH_a$ and $O_a$ formation on both single crystal and polycrystalline surfaces. In both cases, it is the formation of the oxide which appears to be inhibited by the presence of an I ad-layer. This result may be somewhat similar to that observed for S-modified Cu, as described, for example, in G. Seshadri et al., *J. Electrochem. Soc.*, 146, 1762 (1999), and S-modified Fe polycrystalline, as described, for example, in G. Seshadri et al., *Corros. Sci.*, 39, 987 (1997), electrodes exposed to aqueous electrolytes under controlled potential conditions. In those cases, the presence of S resulted in relatively greater hydroxide vs oxide formation, and this was attributed to S inhibition of the complete dissociation of $H_2O_a$, as in (4). The results observed here (FIGS. 4A-4D, FIGS. 6A-6D) appear to suggest that $I_a$/Ru blocks $OH_a$ dissociation under vapor conditions, but blocks conversion of $O_a$ to $RuO_2$ in liquid.

Figure 10:
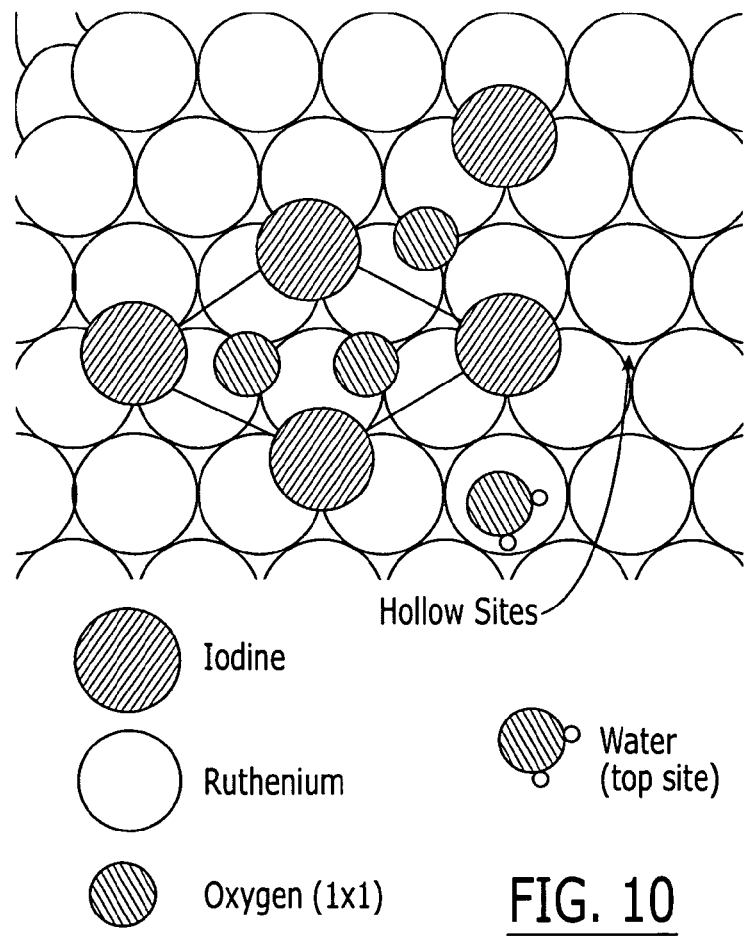
FIG. 10 illustrates possible adsorption sites for oxygen and water molecules on the Ru(0001) surface with a Ru(0001)-($\sqrt{3}\times\sqrt{3}$)R30°-I superstructure, according to embodiments of the present invention.

The ability of $I_a$ to block OH dissociation may be accounted for by a simple steric model in which I occupies 3-fold sites on the Ru(0001) surface (FIG. 10). Halogen occupancy of high coordination sites is generally observed for semi-noble surfaces, as described, for example, in S. B. Dicenzo et al., *Surf. Sci.*, 121, 411 (1982). Some of the three-fold sites are blocked by I occupancy, but on-top and some three-fold sites are accessible. $O_a$ on Ru also occupies three-fold sites, as described, for example, in T. E. Madey et al., *Surf. Sci.*, 48, 304 (1975), and therefore the formation of an $O_a$ surface layer is partly inhibited by I. In contrast, $H_2O$ adsorption occurs on on-top sites, as described, for example, in M. Nakamura, and M. Ito, *Chem. Phys. Lett.*, 325, 293 (2000). Therefore, while the initial chemisorption of $H_2O$ is not inhibited by the I ad-layer, further dissociation to $O_a$ appears to be limited by access to surface three-fold sites (FIG. 10). While this model accounts for the results of ambient air or vapor-phase exposure (FIG. 4A, 4B; FIG. 6A, 6B), interactions at the liquid-solid interface may be complicated by the presence of a double layer and charged species. In addition, the further exposure of the surface to vapor upon emersion from the liquid may need to be considered. The specific I inhibition of oxide formation, however, may be explainable if the formation of a complete $O_a$ (1×1) ad-layer is presumed to be a necessary precursor to the penetration of subsurface oxygen, a described, for example, in A. Bottcher, and H. Niehus, *J. Chem. Phys.*, 110, 3186 (1999) and C. Stampfl et al., *Phys. Rev. Lett.*, 77, 3371 (1996), which leads to the formation of $RuO_2$, as described, for example, in K. Reuter et al., *Chem. Phys. Lett.*, 352, 311 (2002), as indicated by UHV studies and theoretical calculations. In such a case, the high activity of $H_2O$ at the liquid/solid interface could result in high occupancy of available $OH_a$ and $O_a$ sites, as appears in FIGS. 4C, 4D and FIGS. 6C, 6D. As long as a significant number of three-fold sites remain occupied by $I_a$, is appears that the formation of the $O_a(1\times1)$ ad-layer will be prevented, and the formation of $RuO_2$ therefore inhibited.

The ability of $I_a$ to "float" on top of a depositing (or etching) Cu film appears to be shown from the data presented in FIGS. 8A-8E and 9. The "floating" ability of I has been demonstrated for repeated cycles of under potential deposition (UPD) on I-modified Pt, as described, for example, in J. L. Stickney et al., *J Electrochem. Soc.*, 131, 260 (1984) and S. Chia-Haw, and Y. Shueh-Lin, *J. Phys. Chem. B*, 105, 5489 (2001) and other surfaces, as described, for example, in A. Martinez-Ruiz et al., *Surf. Sci.*, 476, 139 (2001). As pointed out by Kolb and co-workers, as described, for example, by L. A. Kibler et al., *Surf. Sci.*, 443, 19 (1999), however, overpotential deposition (OPD) is an electronically and physically distinct process from UPD, which may result in complete discharge of the Cu ion. Further, even a small increase in potential from the UPD to OPD region can result in a qualitative change in nucleation kinetics, as observed for Pd OPD on Au(111), as described, for example, in M. T. Quayum et al., *J. Electroanal. Chem.*, 520, 126 (2002). Therefore, the ability of adsorbed I to remain on top of a film deposited under OPD conditions may in no way be assumed on the basis of UPD studies. The data in FIGS. 8A-8E and 9 therefore appear to demonstrate that $I_a$ on Ru appears to have the necessary stability to survive cycling of the electrode over a reasonably broad potential range, and the ability to be continually displaced to surface sites of the Cu film during OPD. The apparent increase in I intensity upon Cu deposition (FIGS. 8A-8E) appears to be attributable to the fact that the immersion method, which involves electrode surface being placed on top of the electrochemical cell so that the meniscus wets the surface, as described, for example in T. C. Lin et al., *Langmuir*, 14, 3673 (1998) and G. Seshadri et al., *J. Electrochem. Soc.*, 146, 1762 (1999) can result in inhomogeneous concentrations and/or deposition across the ~1 cm diameter electrode surface. This was verified by further immersion/polarization studies on I-modified polycrystalline electrodes, which showed marked variation in the XPS intensities of Cu, I and adsorbed anion species as the sample source area was systematically varied across the surface. The data in FIG. 9 appears to demonstrate that Cu deposition results in no significant I penetration into the bulk of either the growing Cu film or the Ru substrate.

Although concentration inhomogenieties across the electrode surface obviate any detailed kinetic analysis of I effects on the electrodeposition process, the data in FIG. 7 appears to demonstrate that $I_a$ shifts the onset of $H_2$ evolution to higher potentials, and yields a distinct Cu deposition wave. Although the apparent Cu deposition current is larger for the I-modified electrode (FIG. 7), the possible effects of a larger effective electrode area due to slight changes in the position of the surface relative to the meniscus may not be rigorously excluded. In addition, it may not yet be understood whether the shift the stripping peak to lower potentials on the I-modified surface is due specifically to I, or to some other effect related to the excursion to larger negative potentials on the I modified electrode.

Accordingly, XPS and LEED measurements have been carried out on Ru(0001) electrodes exposed to $I_2$ vapor at 300 K and on I-modified and clean Ru(0001) and Ru(poly) electrodes exposed to ambient vapor and liquid $H_2O$ environments at 300 K. The results appear to show that an ordered $(\sqrt{3}\times\sqrt{3})R30°$-I ad-layer is formed after 10.4 L $I_2$ exposure at 300 K, but becomes disordered upon higher $I_2$ exposures at this temperature. Annealing to 400 K restores the ordered ad-layer, while annealing to 700 K in UHV removes I from the surface.

The $(\sqrt{3}\times\sqrt{3})R30°$-I ad-layer appears to survive exposure of the Ru(0001) sample to ambient air or to air and immersion in water under open-circuit conditions. The I ad-layer appears to passivate the Ru(0001) surface against significant hydroxide, chemisorbed oxygen or oxide formation during exposure to air. Immersion of I-Ru(0001) appears to result in greater hydroxide and chemisorbed oxygen formation than air exposure. The I ad-layer, however, appears to still greatly inhibit oxide formation. Similar results appear to be observed for I-modified Ru(poly).

XPS studies have also been carried out on clean and I-modified Ru(poly) electrodes Cu-containing, I-free electrolyte and polarized at potentials between −0.6 V and 0.09 V vs RHE, and then transferred to UHV without atmospheric exposure. Cyclic voltammetric measurements appear to indicate that $I_a$ shifts $H_2$ evolution to more negative potentials, permitting the observation of a distinct Cu deposition wave in the voltammogram. XPS measurements appear to show that I is not buried by Cu deposition under OPD conditions, but floats on top of the growing Cu film.

The above data appear to indicate that I bonding to Ru is sufficiently robust as to survive air exposure and immersion in water, while passivating the surface against oxide formation. In addition, adsorbed I does not appear to be buried during Cu OPD on Ru, but appears to float to the surface of the growing Cu film. These findings may have practical implications for the use of I ad-layers for passivation and as a surfactant for the electrodeposition of Cu onto Ru diffusion barriers for microelectronics fabrication.

TABLE 1

| Samples and exposure conditions | | | Oxide (~530 eV) | Chemisorbed Oxygen (~531.1 eV) | Hydroxide (~532.5 eV) | Estimated thickness of oxide overlayer (Å) |
|---|---|---|---|---|---|---|
| Ru (0001) | Air exposure | Ru(0001) + air | 0.030 | 0.012 | 0.007 | 1.8 |
| | | I-Ru(0001) + air | 0.001 | 0.005 | 0.007 | 0.07 |
| | Liquid Water exposure | Ru(0001) + air + water | 0.049 | 0.019 | 0.012 | 2.2 |
| | | I-Ru(0001) + air + water | 0.006 | 0.021 | 0.008 | 0.3 |
| Ru (poly) | Water Vapor exposure | Ru(poly) + vapor | 0.065 | 0.044 | 0.025 | 3.4 |
| | | I-Ru(poly) + vapor | 0.001 | 0.009 | 0.009 | 0.1 |
| | Liquid Water exposure | Ru(poly) + vapor + water | 0.093 | 0.056 | 0.030 | 4.4 |
| | | I-Ru(poly) + vapor + water | 0.009 | 0.048 | 0.028 | 0.6 |

Column header spans: "Intensity ratios of $O(1s)/Ru(3d_{5/2})$ for components in experimental O(1s) spectra" covers Oxide, Chemisorbed Oxygen, and Hydroxide columns.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A conductive structure comprising:
   a first conductor;
   a plurality of atomic layers of a second conductor directly on the first conductor; and
   a first solid material directly on the plurality of atomic layers of the second conductor, remote from the first conductor, the first material being penetrable by the plurality of atomic layers of the second conductor relative to at least a second material other than the second conductor;
   wherein the first conductor comprises a platinum group metal, the first material comprises a halogen, the second conductor comprises a metal and the second material comprises oxygen; the structure further comprising a substrate on the first conductor, remote from the plurality of atomic layers of the second conductor.

2. The structure according to claim 1 wherein the substrate comprises an integrated circuit wafer.

3. The structure according to claim 1 wherein the first material comprises about a monolayer of the first material.

4. A conductive structure comprising:
   a first layer comprising ruthenium;
   a second layer comprising a plurality of atomic layers of copper directly on the first layer comprising ruthenium; and
   a third layer comprising iodine directly on the second layer comprising a plurality of atomic layers of copper, remote from the first layer comprising ruthenium;
   wherein the third layer comprises about one monolayer of iodine, the structure further comprising a substrate on the first layer, remote from the second layer.

5. A The structure according to claim 4 wherein the substrate comprises an integrated circuit wafer.

* * * * *